(12) United States Patent
Denkenberger

(10) Patent No.: US 9,618,278 B2
(45) Date of Patent: Apr. 11, 2017

(54) MICROCHANNEL EXPANDED HEAT EXCHANGER

(75) Inventor: David C. Denkenberger, Durango, CO (US)

(73) Assignee: Denkenberger Thermal, LLC, Goodlettsville, TN (US)

( * ) Notice: Subject to any disclaimer, the term of this patent is extended or adjusted under 35 U.S.C. 154(b) by 1123 days.

(21) Appl. No.: 13/513,276

(22) PCT Filed: Dec. 2, 2010

(86) PCT No.: PCT/US2010/058797
§ 371 (c)(1),
(2), (4) Date: Jun. 1, 2012

(87) PCT Pub. No.: WO2011/069015
PCT Pub. Date: Jun. 9, 2011

(65) Prior Publication Data
US 2012/0291991 A1 Nov. 22, 2012

Related U.S. Application Data

(60) Provisional application No. 61/265,967, filed on Dec. 2, 2009.

(51) Int. Cl.
*B21D 53/04* (2006.01)
*F28D 21/00* (2006.01)
(Continued)

(52) U.S. Cl.
CPC ....... *F28D 21/0015* (2013.01); *B21D 53/045* (2013.01); *B23K 26/0846* (2013.01);
(Continued)

(58) Field of Classification Search
CPC .... F28F 3/14; F28F 2275/067; F28F 2260/02; B21D 53/045; B23K 26/0846;
(Continued)

(56) References Cited

U.S. PATENT DOCUMENTS 3,291,206 A * 12/1966 Nicholson ............. F28D 9/0037
165/166
4,174,987 A * 11/1979 Belvin et al. ................. 156/197
(Continued)

FOREIGN PATENT DOCUMENTS

| JP | 411270985 A | * 10/1999 |
|---|---|---|
| JP | 2002340488 | 11/2002 |
| WO | 2008/125755 | 10/2008 |

OTHER PUBLICATIONS

International Search Report and Written Opinion dated Aug. 25, 2011, PCT Application No. PCT/US2010/058797, 9 pages.
(Continued)

*Primary Examiner* — Tho V Duong
(74) *Attorney, Agent, or Firm* — Dorsey & Whitney LLP

(57) ABSTRACT

A microchannel heat exchanger (800) is manufactured by bonding a first sheet (802a) of material and a second sheet (802b) of material in a first connection pattern for integral formation of a core portion (801) and a manifold portion (808) for the first and second sheets (802a, 802b) of material. A third sheet (802c) of material is then superposed on to the second sheet (802b) of material and bonded in a second connection pattern to the second sheet of material for integral formation of the core portion (801) and the manifold portion (808) for the second and third sheets (802b, 802c) of material. The second and third sheets (802b, 802c) of material are bonded without bonding the second sheet (802b) of the material to the first sheet (802a) of material. The core portion (801) and the manifold portion (808) of the heat exchanger (800) are thus integrally created. The interstices between the first, second, and third sheets (802a, 802b, 802c) of material are then expanded to create fluid flow channels (806). This method can also be used to create a heat sink. The bonding method may be a form of laser welding where an opaque sheet absorbs the laser energy and
(Continued)

the heat conducts through the top sheet to the sheet immediately below, but does not cause bonding with subsequent sheets below.

20 Claims, 25 Drawing Sheets

(51) Int. Cl.

| | | |
|---|---|---|
| B23K 26/08 | (2014.01) | |
| B23K 26/20 | (2014.01) | |
| B29C 65/16 | (2006.01) | |
| B29C 65/00 | (2006.01) | |
| F28F 3/14 | (2006.01) | |
| F28F 21/06 | (2006.01) | |
| H01L 23/367 | (2006.01) | |
| H01L 23/467 | (2006.01) | |
| B29C 65/14 | (2006.01) | |
| B29C 65/48 | (2006.01) | |
| B23K 26/32 | (2014.01) | |
| B23K 26/323 | (2014.01) | |
| B29C 65/24 | (2006.01) | |
| B29C 65/52 | (2006.01) | |
| B29L 31/18 | (2006.01) | |
| B29L 31/00 | (2006.01) | |
| B29C 65/18 | (2006.01) | |
| B23K 103/00 | (2006.01) | |
| B23K 103/16 | (2006.01) | |

(52) U.S. Cl.
CPC .......... *B23K 26/206* (2013.01); *B23K 26/32* (2013.01); *B23K 26/323* (2015.10); *B29C 65/1496* (2013.01); *B29C 65/1629* (2013.01); *B29C 65/1696* (2013.01); *B29C 65/48* (2013.01); *B29C 66/1122* (2013.01); *B29C 66/348* (2013.01); *B29C 66/438* (2013.01); *B29C 66/4322* (2013.01); *B29C 66/73115* (2013.01); *B29C 66/81267* (2013.01); *B29C 66/83413* (2013.01); *B29C 66/83417* (2013.01); *F28F 3/14* (2013.01); *F28F 21/065* (2013.01); *H01L 23/3672* (2013.01); *H01L 23/467* (2013.01); *B23K 2203/16* (2013.01); *B23K 2203/50* (2015.10); *B29C 65/1612* (2013.01); *B29C 65/1635* (2013.01); *B29C 65/18* (2013.01); *B29C 65/245* (2013.01); *B29C 65/526* (2013.01); *B29C 66/21* (2013.01); *B29C 66/71* (2013.01); *B29C 66/727* (2013.01); *B29C 66/83411* (2013.01); *B29C 66/83431* (2013.01); *B29C 66/83517* (2013.01); *B29C 66/919* (2013.01); *B29C 66/9141* (2013.01); *B29C 66/91921* (2013.01); *B29C 66/91931* (2013.01); *B29C 66/934* (2013.01); *B29C 66/939* (2013.01); *B29C 66/949* (2013.01); *B29K 2995/0025* (2013.01); *B29K 2995/0027* (2013.01); *B29K 2995/0065* (2013.01); *B29K 2995/0069* (2013.01); *B29L 2031/18* (2013.01); *B29L 2031/756* (2013.01); *F28F 2260/02* (2013.01); *F28F 2275/067* (2013.01); *H01L 2924/0002* (2013.01); *Y02E 10/34* (2013.01); *Y10T 156/10* (2015.01)

(58) Field of Classification Search
CPC .............. B23K 26/206; B23K 26/3206; B23K 26/3233; B23K 26/328; B29C 65/1629; B29C 65/1696; B29C 65/46; B29C 65/1635; B29C 65/526; B29C 65/1612; B29C 66/1122; B29C 66/348; B29C 66/4322; B29C 66/438; B29C 66/73115; B29C 66/83411; B29C 66/81267; B29C 66/21; B29C 66/71; B29C 66/919; B29C 66/939; B29C 66/949; B29C 66/934; B29D 99/0089; F28D 21/0015; B29L 2031/18
USPC ............... 29/890.042, 44; 165/165, 166, 167
See application file for complete search history.

(56) References Cited

U.S. PATENT DOCUMENTS

| | | | |
|---|---|---|---|
| 4,411,310 A | | 10/1983 | Perry et al. |
| 4,603,460 A | * | 8/1986 | Yano et al. ............. 29/890.039 |
| 5,138,765 A | | 8/1992 | Watson et al. |
| 5,222,551 A | * | 6/1993 | Hasegawa et al. ........... 165/167 |
| 5,383,518 A | * | 1/1995 | Banks et al. .................. 165/166 |
| 5,385,204 A | * | 1/1995 | Boardman et al. ........... 165/170 |
| 5,421,935 A | * | 6/1995 | Dixon et al. .................. 156/197 |
| 5,505,256 A | * | 4/1996 | Boardman et al. ........... 165/166 |
| 5,725,051 A | | 3/1998 | Veltkamp |
| 6,032,730 A | * | 3/2000 | Akita et al. ................... 165/166 |
| 6,758,261 B2 | | 7/2004 | Ramm-Schmidt |
| 7,258,263 B2 | * | 8/2007 | Sigler et al. .................. 228/157 |
| 2003/0173067 A1 | * | 9/2003 | Ramm-Schmidt .... F28D 9/0087 165/164 |
| 2005/0077637 A1 | | 4/2005 | Mockry et al. |
| 2008/0210415 A1 | * | 9/2008 | Crayssac et al. ............. 165/170 |

OTHER PUBLICATIONS

Ahuja, Vikas et al., "Carbon Dioxide Removal from Air for Alkaline Fuel Cells Operating with Liquid Hydrogen—A Synergistic Advantage," International Journal of Hydrogen Energy, vol. 23, No. 2, pp. 131-137, 1998.

Askeland, D.R., The Science and Engineering of Materials Third Edition, PWS Publishing Company, Boston, 1994, p. 499.

Carman, B.G. et al., "Impact of a Ceramic Microchannel Heat Exchanger on a Micro Turbine," Proceedings of the ASME Turbo Expo 2002, p. 1-8, Amsterdam, The Netherlands, Jun. 3-6, 2002.

Garst, Sebastiaan et al., Fabrication of Multilayered Microfluidic 3D Polymer Packages, 2005 Electronic Components and Technology Conference, pp. 603-610 . . . .

Lowenstein, Andrew, "A Zero Carryover Liquid-Desiccant Air Conditioner for Solar Applications," Proceedings of ISEC2006, ASME International Solar Energy Conference, Denver, CO, USA, Jul. 8-13, 2006, 14 pages.

Wilson, David G., "Wilson TurboPower's David Gordon Wilson Presents Seminal Scientific Paper at International Turbine Congress; Peer-Reviewed Paper Outlines the Theory and Design of Wilson TurboPower's New Revolutionary Heat Exchanger," Business Wire, May 15, 2006, 2 pages. http://findarticles.com/p/articles/mi_m0EIN/is_2006_May_15/ai_n16361655/pg_1 accessed Apr. 2008.

* cited by examiner

KEY
⊗ FLOW INTO PAGE
⊙ FLOW OUT OF PAGE
▨ COLD
▒ HOT
▨ INSULATION
ⱳⱳ LOOSE POLYMER

AIR

AIR

| POLYMER | GLAS- $T_g[°C]$ | FLOW- $T_f[°C]$ | CRYST. MELT- $T_m[°C]$ | DECOMP. $T_d[°C]$ |
|---|---|---|---|---|
| ABS | | | | |
| PA6 | 40 | | 220 | ~327 |
| PA66 | | 240 | | 325 |
| PC | 145 | | | |
| HD-PE | -95 | | 130-140 | 300-390 |
| PEEK | 120 | | 340 | |
| PMMA | 104 | 180 | | 226-256 |
| POM | -18 | | 160-206 | 336-366 |
| PP | | | | |
| PS | 97 | 160 | | 318-348 |
| PTFE | -20 | | 327 | 424-513 |
| PVC | 80 | 175 | | ~250 |
| SAN | | | | |

CHARACTERISTIC TEMPERATURES FOR POLYMERS: ▦ MELTING RANGE ▓ DECOMPOSITION

FIG. 16

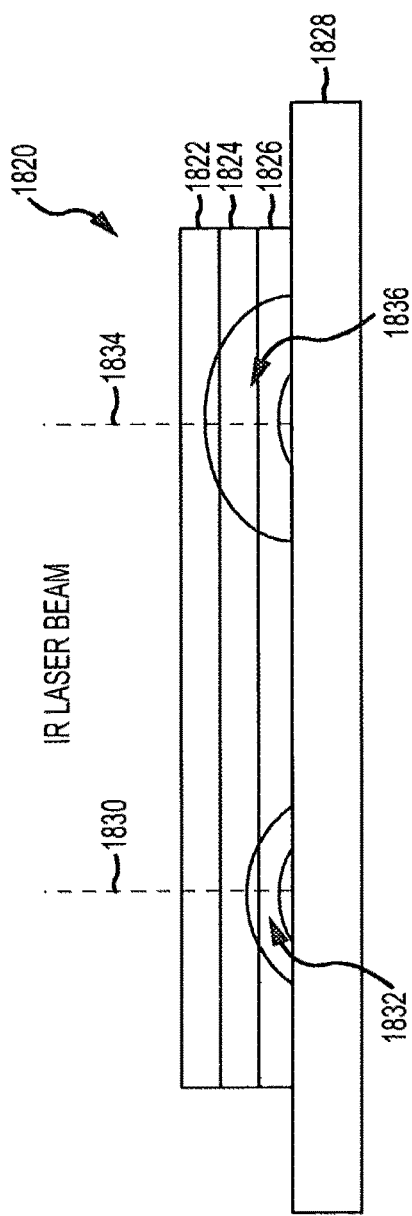
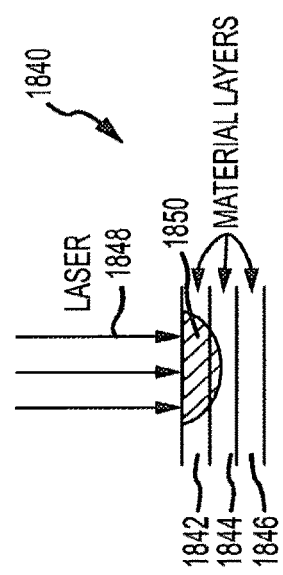
FIG. 18B (PRIOR ART)
FIG. 18C

| MATERIAL | MELTING T (°C) | DECOMPOSITION/ BOILING T (°C) | % RANGE AT 20°C | % RANGE AT HALF MELTING T IN °C |
|---|---|---|---|---|
| ALUMINUM | 660 | 2470 | 74 | 85 |
| COPPER | 1080 | 2930 | 64 | 77 |
| HDPE | 140 | 350 | 64 | 75 |
| SILVER | 962 | 2162 | 56 | 71 |
| PP | 170 | 350 | 55 | 68 |
| PS | 160 | 310 | 52 | 65 |
| TITANIUM | 1660 | 3290 | 50 | 66 |
| IRON | 1540 | 2750 | 45 | 61 |
| PA6 (NYLON) | 210 | 320 | 36 | 51 |
| PTFE (TEFLON) | 330 | 470 | 31 | 45 |

FIG.22

MICROCHANNEL EXPANDED HEAT EXCHANGER

CROSS REFERENCE TO RELATED APPLICATIONS

This application claims the benefit of priority to U.S. provisional application No. 61/265,967 filed 2 Dec. 2009 entitled "Microchannel expanded heat exchanger," which is hereby incorporated herein by reference in its entirety for the purposes of PCT Rule 20.6.

FIELD

The present disclosure relates to heat exchangers. More specifically, the present disclosure relates to microchannel heat exchangers and methods for manufacturing microchannel heat exchangers.

BACKGROUND

Heat exchangers transfer heat from one fluid to another (both liquids and gases are considered fluids). Heat exchangers are used in refrigeration cycles, heat recovery, industrial processes, and conventional power plants. Typical heat exchanger applications are found in vehicles, heating, ventilation, and air conditioning (HVAC) systems, conventional power plants, and industrial processes. Heat exchangers may also be used in renewable energy applications including, for example, fuel cells, concentrated solar power, solar hot water, compressed air energy storage, wind turbine radiators, geothermal power plants, ocean thermal energy conversion, and solar water pasteurization. Additional applications include micro gas turbines for stationary or mobile applications, portable cooling (e.g., hazardous material suits), liquid-cooled electronics, Stirling engines, cryogenics, and natural gas regasification.

The effectiveness η of a heat exchanger is the amount of heat transferred as a fraction of the maximum amount that can be transferred (or roughly the temperature (T) change as a fraction of the ideal temperature change):

$$\eta = \frac{T_{c,o} - T_{c,i}}{T_{h,i} - T_{c,i}} \quad \text{Equation 1}$$

For example, if an input hot temperature in a heat exchanger is 70° C., an input cold temperature is 30° C., and the output cold temperature is 65° C., the η would be 87.5%. A typical effectiveness η for heat exchangers is approximately 70%.

In one example, one micro gas turbine regenerator reached η=98% (Wilson, David G. "Wilson TurboPower's David Gordon Wilson Presents Seminal Scientific Paper at International Turbine Congress; Peer-Reviewed Paper Outlines the Theory and Design of Wilson TurboPower's New Revolutionary Heat Exchanger." *Business Wire*, May 15, 2006, http://findarticles.com/p/articles/mi_m0EIN/is_2006_May_15/ai_n16361655/pg_1 accessed April, 2008). This promises to produce a 50% efficient micro turbine, which rivals the efficiency of central power generation, but would allow easy recovery of waste heat because of the small size (and thus small heat transportation distance). A gas-to-gas heat exchanger for a fuel cell reached η=97% (Ahuja, Vikas and Roger Green. "Carbon Dioxide Removal to from Air for Alkaline Fuel Cells Operating with Liquid Hydrogen: A Synergistic Advantage."*International Journal of Hydrogen Energy*, Vol. 23, No. 2, pp. 131-137, 1998).

In general, a heat exchanger includes a core and one or more manifolds. Various arrangements of the elements that provide heat exchange surfaces are possible. One arrangement includes a plurality of plates arranged parallel to each another and spaced apart from each other, such that a plurality of adjacent passageways are formed by the various sets of plates. This arrangement may be referred to as a flat plate heat exchanger. One heat exchange medium is directed through a first set of alternately spaced passages, while the second heat exchange medium is directed through the second set of passageways spaced intermittently with the first set. Thus, heat is transferred from one heat exchange medium to the other through the plates.

Another arrangement includes providing heat exchange elements in the form of elongate tubes which extend through a chamber and are spaced apart from one another. One heat exchange medium is directed into the interior of the tubes, while the other heat exchange medium is directed into the area between and around the outside of the tubes. U.S. Pat. Nos. 3,289,281; 3,354,533; 3,911,843; 4,295,255; 5,138,765; and 5,568,835 all disclose two sheets that are hydraulically expanded to form flow channels for one fluid, and then the other fluid flows outside the expanded channels. Some have multiple layers of this arrangement.

Still other arrangements have been configured. For example, Lowenstein describes extrusion of one row of tubes with 1.2 mm inside diameter and 0.2 mm wall thickness (Lowenstein, Andrew; "A Zero Carryover Liquid-Desiccant Air Conditioner for Solar Applications," ASME/SOLAR06, Denver, Colo., USA, Jul. 8-13, 2006). It may be possible to extrude multiple rows of tubes, or just stack single rows. The two fluids may be directed in alternate tubes flowing in opposite directions in a "chessboard" fashion (see prior art FIG. 1). A manifold arrangement for this "chessboard" pattern is described by Veltkamp in U.S. Pat. No. 5,725,051 (the '051 patent) and is shown in prior art FIG. 2. The manifold is constructed using multiple sections (11, 10, 7) that distribute fluid from two external ports ultimately across a multiplicity of ports to interface with the stack of ducts in the core. An alternate manifold scheme for the "chessboard" is shown in prior art FIG. 3 of the '051 patent, where the ducts are configured in a diagonal pattern with each duct in a row transporting a common temperature fluid. Both manifold types are described as constructed using injection molding techniques. However, the alignment of the heat exchanger core and manifold may be problematic for microchannels. Arranging the heat exchanger core with alternating triangles is also described in the '051 patent.

As shown in prior art FIG. 4, Carman also describes a triangular arrangement for a microturbine heat exchanger. (Carman, B. G.; J. S. Kapat; L. C. Chow; and L. An; "Impact of a Ceramic Microchannel Heat Exchanger on a Micro Turbine," Proceedings of the ASME Turbo Expo 2002, p. 1053-1060, Amsterdam, The Netherlands, Jun. 3-6, 2002). Carman describes solidifying a polymer with a laser, producing 0.05 mm walls, and then pyrolizing the polymer into a ceramic to handle high fluid pressures. U.S. Pat. No. 4,411,310 issued to Perry (the '310 patent) proposes welding polymer films together along lines and expansion to produce a "chessboard" flow pattern as shown in prior art FIG. 5. However, spacers have to be placed between the layers so the weld does not go through more than two layers. Also, it is difficult to align the above core structure with the manifold for microchannels.

The '310 also discloses an automated process for manufacturing a heat exchanger as exemplified in prior art FIG. 6 using film from rollers and spacers, but the core still has to be aligned with the manifold after manufacturing in a process that does not work well for microchannels. U.S. Pat. No. 6,758,261 issued to Ramm-Schmidt also describes welding two polymer layers (3) together and to a support layer (4) and then stacking the welded layers to form a heat exchanger with flow channels (5, 7), as shown in prior art FIG. 7. Flow channels (5) are depicted as semi-circular while flow channel spaces (7) are diamond-shaped. However, if a fluid in the flow channels (7) has a much higher pressure, then the diamond flow channels (7) turn into cylinders and collapse the complementary flow channels (5). Such a core design is also difficult to align with a manifold if the channels are small.

The information included in this Background section of the specification, including any references cited herein and any description or discussion thereof, is included for technical reference purposes only and is not to be regarded subject matter by which the scope of the invention is to be bound.

SUMMARY

A heat exchanger is disclosed herein that is formed by joining sheets of material in a specific pattern and then expanded. In some embodiments, the sheets of materials may include, but are not limited to, polymers, metals, polymers that are ceramic precursors, and composites of these groups of materials. In some embodiments, more than one material may be used in a single heat exchanger assembly with two or more stages to exploit, for example, different temperature tolerances of different materials at different locations in the heat exchanger. The flow configurations of the heat exchanger may be one of counterflow, parallel flow, or cross flow.

The heat exchanger may accommodate more than two fluids, but for the common case of two fluids, the enthalpy of one fluid is increased (if there is no phase change, this means the temperature increases) e.g., the "cold" fluid, and the enthalpy of the other fluid is decreased (if there is no phase change, this means the temperature decreases), e.g., the "hot" fluid. The temperatures of the fluids could range from cryogenic to above the melting or decomposition temperature of the heat exchanger material (as in the case of a boiler where the boundary layer in the fluid protects the heat exchanger material from the hot combustion gases).

In some embodiments, there may be three or more sheets containing spaces between the layers, at least one space for hot and one space for cold. Between each sheet, there may be one or more channels formed by the connections or sealed joints between the layers. The connecting or joining methods may include, but are not limited to, welding (e.g., laser, arc, acoustic, etc.), soldering, brazing, and adhering (using UV cured, epoxy, pressure sensitive, solvent, hot-melt, or other adhesives). In one exemplary implementation, the connecting or joining method may be a form of laser welding where an opaque, sheet absorbs the laser and the heat conducts through the sheet to the sheet below, but does not melt the third or subsequent sheet down.

In some embodiments, the hot or cold fluid may be a gas, liquid, supercritical fluid, or a fluid undergoing a phase change, e.g., boiling, evaporation, or condensation, or a fluid undergoing a chemical reaction.

In some embodiments, the expanded heat exchanger may be permanently fixed in shape or it may be collapsible to be expanded later. Expansion methods may include the use of pressurized gas, pressurized liquid, pressurized fluid undergoing a phase change or chemical reaction, pulling upwards and downwards with structures for sideways contraction (such as a perforated vacuum plate), pulling upwards and downwards with no structures for sideways contraction of the heat exchanger (resulting in expansion where the material stretches).

In some embodiments, a porous material (e.g., Gore-Tex®) may be used so that the walls are permeable to at least one of the fluids, thereby allowing mass transfer (e.g., allowing water to evaporate from a water channel into an air channel in a cooling tower).

In some embodiments, a continuous process for the manufacture of the expanded heat exchanger is used, whereby additional sheets of material are introduced and connected to the existing sheets. The continuous process may include one connection device per connection that has to be made in the heat exchanger, i.e., one fewer than the number of sheets in the heat exchanger. Alternatively, the continuous process may include fewer connection devices than the number of connection layers of the heat exchanger, so the bonded sheets recirculate to have additional sheets connected thereon. The continuous process may include a roller that has a transparent pattern through which the radiation from the laser or filament source passes to make the desired welding or connection pattern on the sheets of material.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. While multiple embodiments are disclosed, still other embodiments of the present invention will become apparent to those skilled in the art from the following detailed description, which shows and describes illustrative embodiments of the invention. As will be realized, the invention is capable of modifications in various aspects, all without departing from the spirit and scope of the present invention. Accordingly, the drawings and detailed description are to be regarded as illustrative in nature and not restrictive.

BRIEF DESCRIPTION OF THE DRAWINGS

FIG. 8A depicts the heat exchanger in a pre-expansion state and FIG. 8B depicts the heat exchanger in a post-expansion state.

FIGS. 13A-13B show cross flow expanded heat exchangers with fin layers (FIG. 13A is normal and FIG. 13B is compact). FIGS. 13C-13D show a counterflow expanded heat exchanger where the flow cross-sectional area is larger for one fluid than the other.

FIG. 16 is a table illustrating characteristic temperatures for polymers.

FIG. 18B is a schematic diagram depicting a prior art reverse conduction laser welding technique.

FIG. 18C is a schematic diagram depicting a forward conduction laser welding technique.

FIG. 22 is a table depicting viable welding range fractions for different materials and different ambient temperatures.

DETAILED DESCRIPTION

Various implementations of a microchannel expanded heat exchanger and methods of manufacturing the same at reduced costs and with increased efficiency are disclosed herein. Accordingly, if a heat exchanger can be manufactured with reduced cost, more heat transfer area can be cost effectively used (or multiple heat exchangers can be placed in series) to achieve high effectiveness thereby saving primary energy and decreasing $CO_2$ and other emissions.

Many heat exchangers utilize turbulent flow, which produces high heat transfer coefficient h. At smaller channel hydraulic diameter, the flow becomes laminar, which reduces h. However, at even smaller hydraulic diameters, the distance that the heat has to conduct through the fluid becomes short, so h increases, even exceeding the turbulent h for very small channels. Furthermore, with laminar flow, even when velocity is decreased, h is maintained (i.e., laminar flow results in a constant Nusselt number (Nu), which is the ratio of the thermal conductance in the fluid with convection to the thermal conductance without convection). Since the head loss decreases with lower velocity, the head loss can be lowered by having many parallel channels.

Figure 8A:
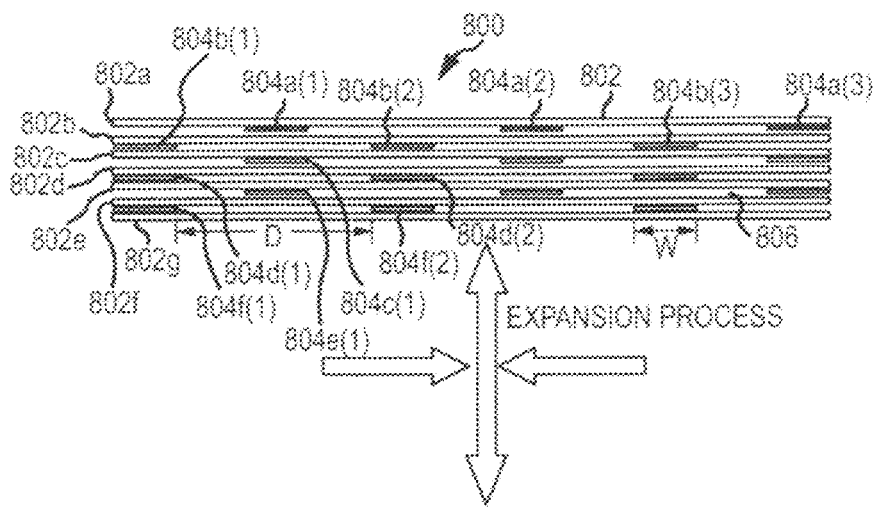
FIGS. 8A and 8B are schematic diagrams in cross section of the expansion process for en exemplary embodiment of the heat exchanger core.
Figure 8B:
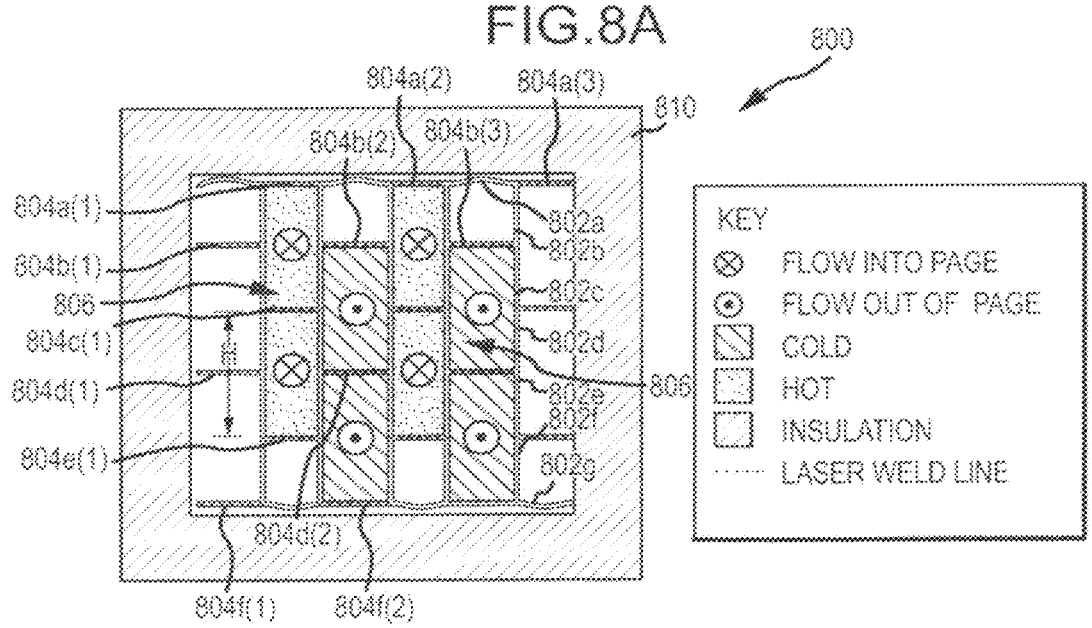

A microchannel heat exchanger includes a core and one or more manifolds. The core may include tubes or channels aligned in rows. The channels are arranged such that the hot and cold fluids flow through alternate adjacent tubes. In one embodiment as shown in FIG. 8A, a microchannel heat exchanger 800 may be formed of multiple sheets 802a-g of a thin film or metal foil joined together along substantially parallel adhesion lines 804a-f that are substantially evenly spaced apart across a dimension of the sheets 802a-g. These lines of adhesion 804a-f may be alternately offset between adjacent sheets (e.g., between 802a and 802b). A width of the lines of adhesion 804a-f may be selected and controlled to determine an ultimate connection width (W) of the microchannels 806 in the heat exchanger core 801. The distance (D) minus the connection width (W) along a sheet between adjacent lines of adhesion is therefore the height (H) of the microchannels 806 as indicated in FIG. 8B.

The microchannels 806 are thus arranged in a "chessboard" fashion and are expanded by "pulling" the opposing faces laminated stacks of film 802a-f apart to expand the channels 806. As shown in FIG. 8B, once the free sections of the laminated sheets 802a-f are pulled apart, generally oblong or rectangular microchannels 806 of the connection width (W) of the lines of adhesion are created. The microchannel heat exchanger core 800 may further be surrounded by an insulating layer 810 to isolate the heat exchange process from temperature effects of the outside environment.

A variety of possible methods of expansion of the microchannels 806 in the heat exchanger 800 are possible. In one embodiment, the top and bottom sheets of film 802a, 802f may be pulled apart to expand the interstices between the layers 802a-g and the adhesion lines 804a-f. In one exemplary process, a vacuum applied through perforated plates placed against the top and bottom layers 802a, 802g of the heat exchanger 800 may be used to expand the channels 806 vertically. In some implementations, the friction between the plates and the heat exchanger 800 may be greater than desired. Therefore, in another exemplary process, the tips of bristles on a brush may be adhered to the top and bottom layers 802a, 802g of the heat exchanger 800 and pulled upward and downward. In any of these embodiments, the simultaneous upward and downward pull expands the channels 806 vertically while contracting the width of the channels 806 horizontally. However, if the top or bottom layer 802a, 802g is rigidly attached to a surface and/or the pulling force applied is too great, a stretching expansion may result. Alternatively, a pressurized fluid (e.g., air, liquid, steam, gas, a fluid undergoing a phase change, or a fluid resulting from a chemical reaction) may be introduced into the interstices to fill the microchannels 806 and expand the device. Once the heat exchanger 800 expands, a rigid frame may be attached to maintain the shape.

In order to provide for "non-stretching expansion" of the microchannels 806 in the microchannel heat exchanger 800, adhesive or thermal welding (e.g., contact adhesive or electromagnetic radiation), or other appropriate methods may be used to form seals between layers of film to create the channels. Such a manufacturing method allows a very large range in dimensions. On the upper end, the connection width (W) of the lines of adhesion 804, and thus the width of the channels 806, may be up to approximately 3 cm, and the sheets 804 may be up to 1 cm thick, provided sufficient connection strength and material malleability. On the lower end, the connection width (W) and associated channel width may be on the order of 10 μm and the sheets 804 may be 10 μm thick (e.g., for low-cost rolling sheet production) or less.

Figure 5:
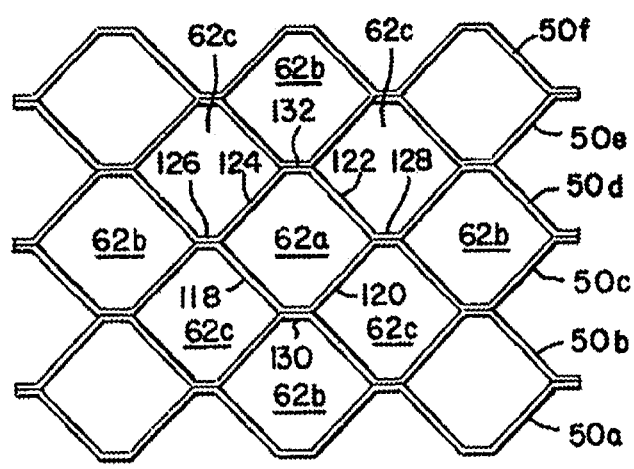
FIG. 5 depicts a prior art expanded core heat exchanger.
Figure 6:
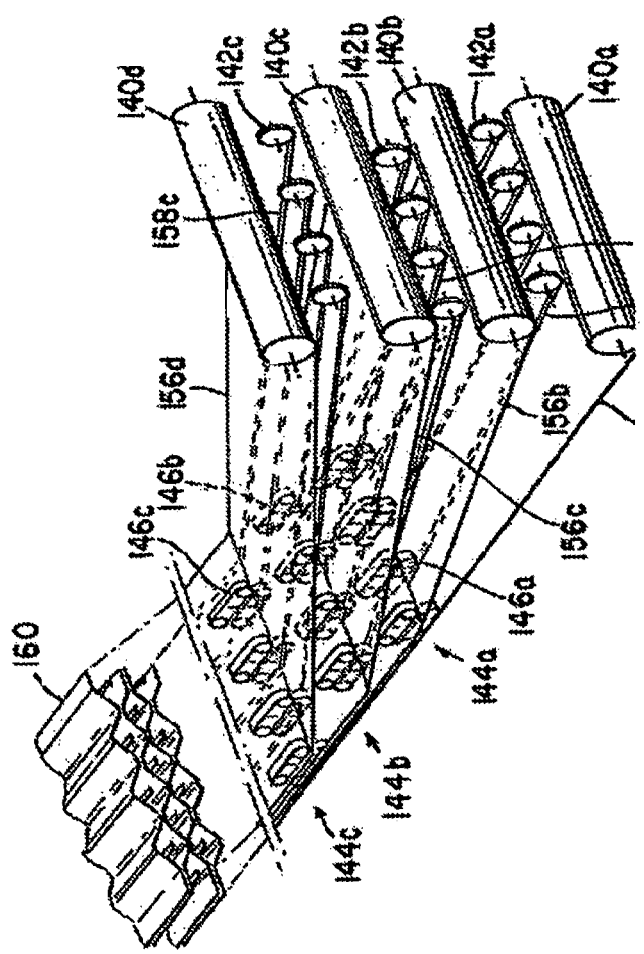
FIG. 6 depicts a prior art automated process for an expanded heat exchanger core.
Figure 7:
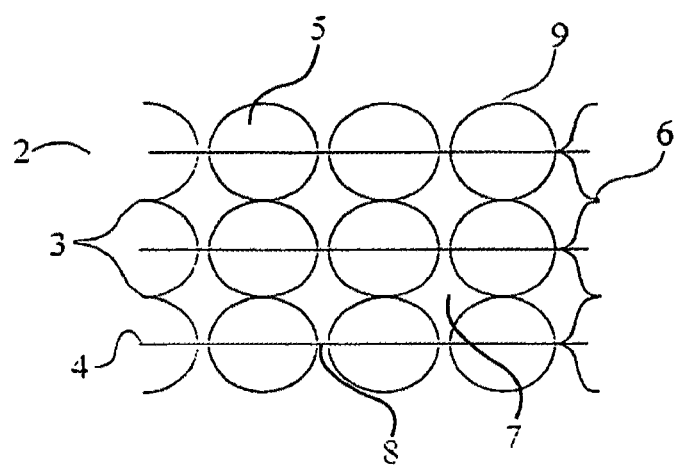
FIG. 7 depicts a prior art expanded stacked heat exchanger with one fluid at high pressure.

For a continuous manufacturing process, alignment accuracy may be taken into consideration. The alignment accuracy may be smaller than the connection width (W) in order to maintain uniform size of the channels 806. This may be important for high effectiveness. For example, in the modeling as described later herein, an alignment accuracy of 10 μm is used. If 10% alignment accuracy is desired, 100 μm channels may be utilized with 10 μm sheets which correspond to the modeling described herein. It may be appreciated that other dimensions of the line of adhesion 804, the sheets 802, and the channels 806 are also contemplated within the scope of the present disclosure. In other embodiments, the channels 806 may be arranged in a different pattern, for example, in a diamond-shaped pattern as that shown in FIG. 5 and expanded by inflation rather than pulling force. As discussed in more detail below, the expansion methods may vary.

Figures 9A, 9B:
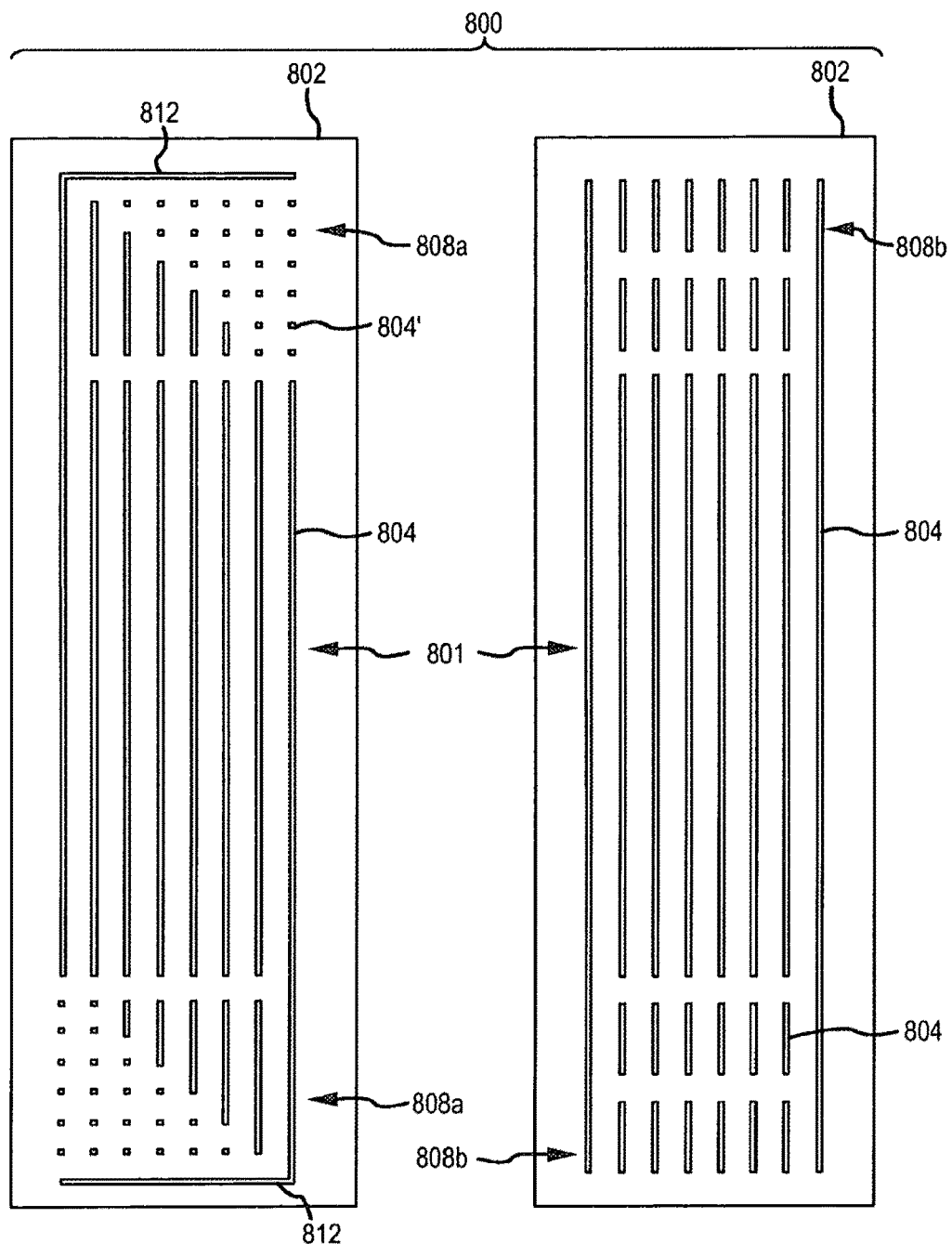
FIGS. 9A and 9B are schematic diagrams of exemplary adhesion lines formed in opposing layers of film for forming a heat exchanger with end manifolds as depicted in FIGS. 10A-10F.

A manifold for fluid input and output into and out of the microchannel heat exchanger may be made using the same channel expansion process within the layers of the laminated film. An exemplary manifold 808 formed in conjunction with a heat exchanger core 801 is presented in FIGS. 9A-9B and 10A-10F. As indicated in FIGS. 9A and 9B, fewer connections are made in the manifolds areas 808a, 808b near the ends of the sheets 802. In this way, the "chessboard" pattern in the heat exchanger core 801 may be converted to fluid layers of alternating hot and cold between sheets 802 at the inlet and outlet locations in order to more easily supply fluid for distribution in the microchannels. As shown in FIG. 9A, the connection pattern formed by the lines of adhesion 804 form "bent" channels where a first fluid (e.g., hot water) enters the lower left side and exits the upper right side. Portions of the lines of adhesion 804 in this layer are actually "spot welds" 804'. Then the end walls 812 of the manifold areas 808a between these layers may be closed (e.g., by welding or other adhesion) to direct the fluid out the sidewall. The connection pattern illustrated in FIG. 9B is formed in "straight" channels where a second fluid (e.g., cold water) enters the top and exits the end walls of the manifold areas 808b.

As can be understood with reference to FIGS. 9A and 9B, when the patterns are superposed, a cross-flow pattern within the manifold sections is formed allowing for separate connection of, for example, hot fluid from side wall inlet and outlet and cold fluid from end wall inlet and outlet, thereby simplifying the connection of fluid supplies to and outlets from the heat exchanger. The spot welds 804' allow for an orthogonal fluid entry for one of the fluids without crossing lines of adhesion 804a-f, which would otherwise create a connection between layers normal to the longitudinal lines of adhesion 804a-f in the heat exchanger core 801, thereby precluding expansion of the microchannels in those locations. Further, with this design the heat exchanger core 801 and the manifold sections 808a, 808b are automatically aligned and joined because they are made in the same process and out of the same sheets of film 802a-g.

Figure 10A:
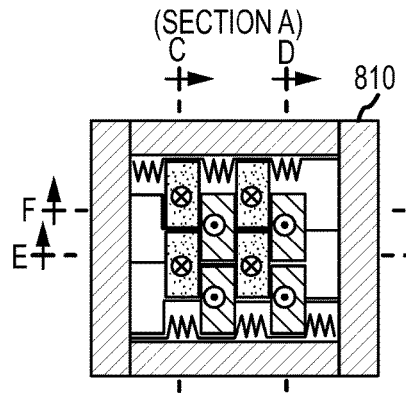
FIGS. 10A-10F are schematic diagrams of various cross sections of an exemplary expanded heat exchanger with manifolds at each end.
Figure 10C:
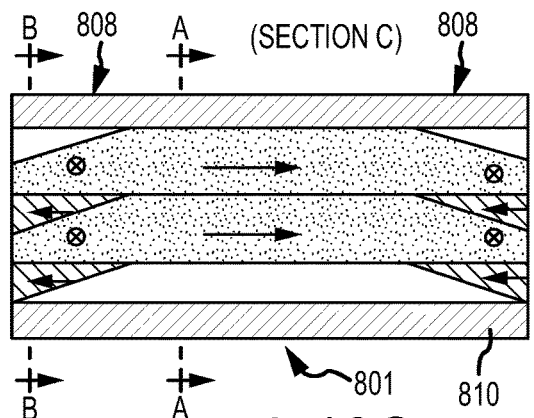
Figure 10B:
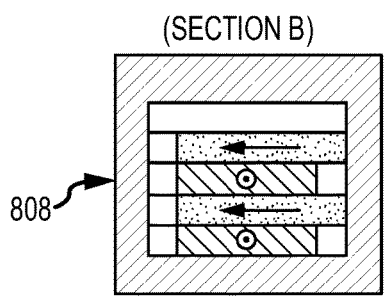
Figure 10D:
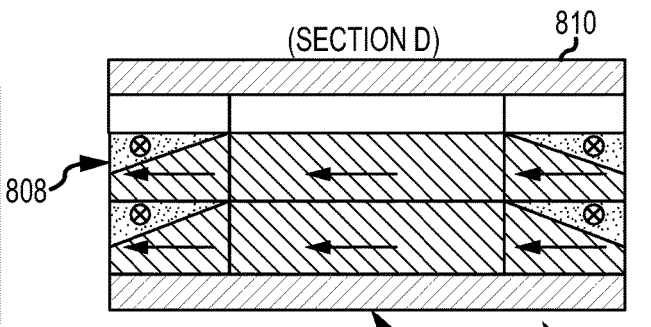
Figure 10E:
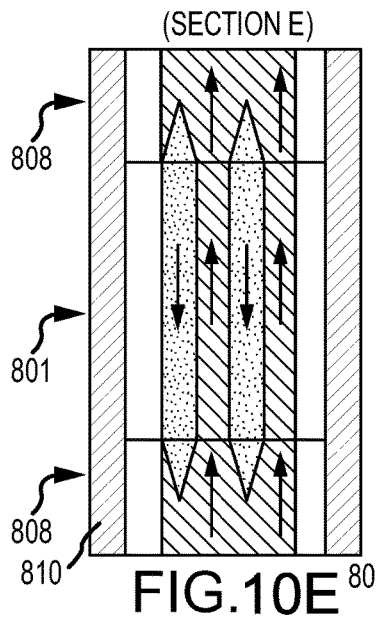
Figure 10F:
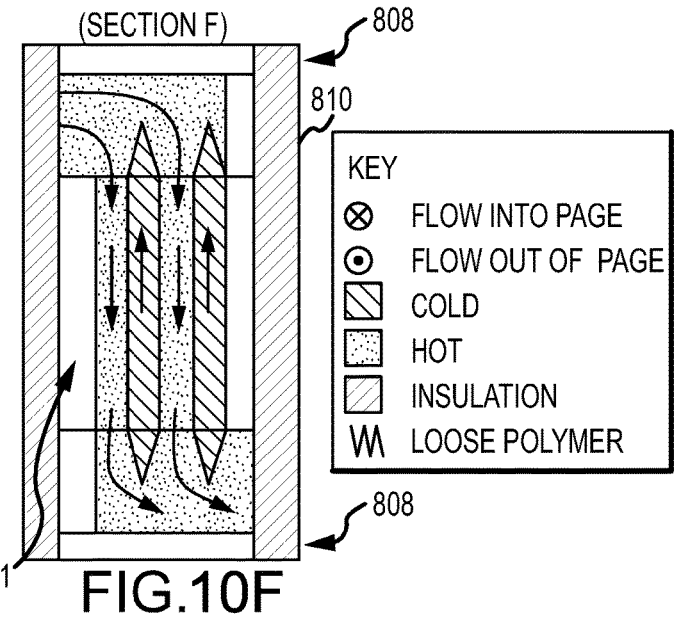

The fluid flow through various portions and layers of the heat exchanger 800 may be seen in the various cross-section views presented in FIGS. 10A-10F. In FIG. 10A, a cross section normal to the length of the heat exchanger within the heat exchanger core 800 is shown. Hot and cold fluids flow in opposite directions in stacked channels of the same flow adjacent stacked channels of the opposing flow. In FIG. 10B, a cross section normal to the length of the heat exchanger within an end manifold section 808 is shown. In this area, the fluid flow between the hot and cold fluids is orthogonal. In FIG. 10C, a vertical cross section through a stack of hot fluid channels parallel to the entire length of the heat exchanger is shown. Orthogonal flow through the manifold sections 808 is apparent. A tapering of the hot channel from tall (and narrow) in the core to short (and wide) in the manifold is also shown. In FIG. 10D, a vertical cross section through a stack of cold fluid channels parallel to the entire length of the heat exchanger is shown. Orthogonal flow through the manifold sections 808 is apparent and an opposite flow direction of the cold fluid as compared to the direction of hot fluid flow in FIG. 10C is shown. In FIG. 10E, a horizontal cross section through a layer of adjacent hot and cold fluid channels parallel to the entire length of the heat exchanger is shown. The cross section of FIG. 10E is taken within a first to layer containing the cold fluid inlet and outlet in the end walls of the manifold sections 808. In FIG. 10F, a horizontal cross section through a layer of adjacent hot and cold fluid channels parallel to the entire length of the heat exchanger is shown. The cross section of FIG. 10F is taken within a second layer containing the hot fluid inlet and outlet in the sidewalls of the manifold sections 808. Superimposition of the cross sections of FIGS. 10E and 10F clearly depicts the opposite fluid flow in the adjacent channels along the length of the heat exchanger, which allows for efficient heat transfer over the entire length of the flow, including in the manifold sections in which counterflow shifts to cross-flow between adjacent upper and lower layers as shown in FIG. 10F. As shown in FIGS. 10A-10F, a rigid frame including an insulation layer 810 may further provide a structure to support the expanded heat exchanger and isolate the heat exchanger from external heating or cooling conditions.

Figure 11A:
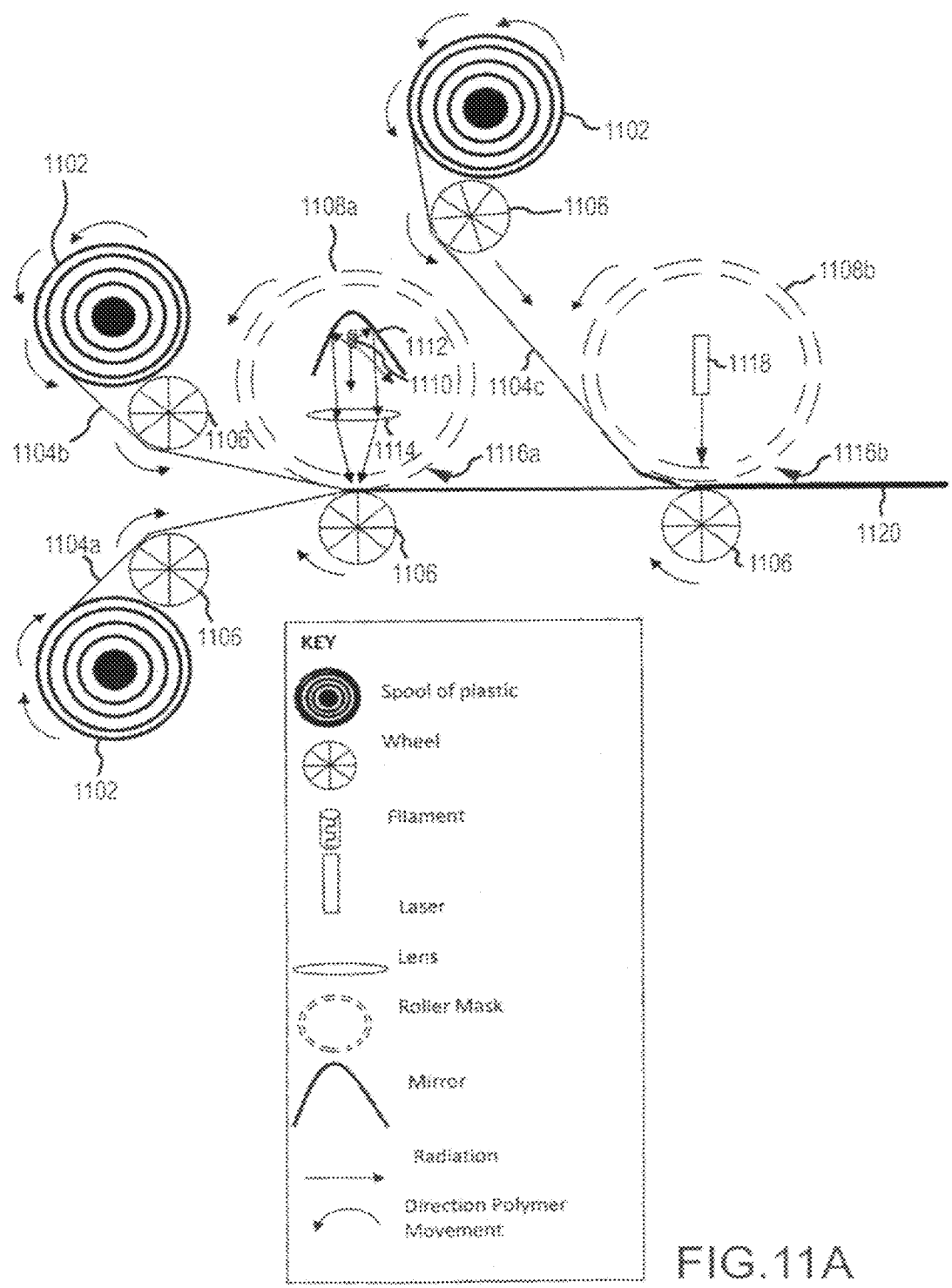
FIG. 11A is a schematic diagram of an embodiment of a system for manufacturing a heat exchanger.

In order reduce the manufacturing costs of a heat exchanger as described above, a continuous manufacturing process may be employed. As shown in FIG. 11A, an exemplary manufacturing system 1100 uses a roll-to-roll process to add and connect layers one at a time. In the implementation depicted, three spools 1102 of film (e.g., a plastic or different types of plastic) or foil web 1104a, 1104b, 1104c are unrolled and fed through an arrangement of tension wheels 1106 to be positioned for lamination. Initially, the first web 1104a is brought into contact with the second web 1104b and the two layers are pinched together between a first roller mask 1108a and a tension wheel 1106. The first roller mask 1108a may be used to direct thermal radiation into a desired welding pattern. The roller mask 1108a is represented schematically in FIG. 11A as having patterned voids, holes, or transparent areas 1116a in the roller surface to transfer the adhesion line pattern to the web layers 1104a, 1104b.

In one implementation, a heated filament 1110 may be positioned to direct energy through the apertures in the first roller mask 1108. Energy radiated by the filament 1110 may be collimated with a mirror 1112 and then focused with a lens 1114 to weld the first and second webs 1104a, 1104b together in the desired pattern to create microchannels. The energy required to weld the heat exchanger is quite small and the filament 1110 is inexpensive, which could provide a low-cost manufacturing option. In an alternate implementation, simultaneously represented in FIG. 11A, the energy radiation pattern may be produced by a laser 1118 having an output that is expanded along a lateral axis. As shown in FIG. 11A, a third web 1104c is directed between a second roller mask 1108b and a tension wheel 1106 to be laminated to the second web 1104b previously laminated to the first web 1104a. The laser energy passing through the transparent areas 1116b in the second roller mask 1108b laminate the third web 1104c to the second web 1104b in a desired pattern. In the presentation of FIG. 11A, the laser 1118 is shown contacting an opaque area and therefore not laminating the webs 1104b, 1104c at that position.

A laser 1118 may provide an added benefit of allowing for the creation of very small channel and manifold dimensions. Further, positioning accuracy of the webs 1104a-c to 0.01 mm is possible, allowing for the generation of heat exchanger channels as small as 0.03 mm wide. Even if a laser 1118 is used for lamination in the system 1100, the cost may be minimized if the process is in continuous operation.

It should be apparent that any number of film webs and roller masks may be added to the system to create heat exchangers with additional layers. Alternatively, after a multilayer sheet 1120 is completed, if tight registration can be achieved, it may be processed through the system 1100 again to add additional layers. After the lamination process is complete, the pre-expanded sheet 1120 may be cut into discrete sections corresponding to independent heat exchangers, which may then be expanded and fixed in shape.

Figure 11B:
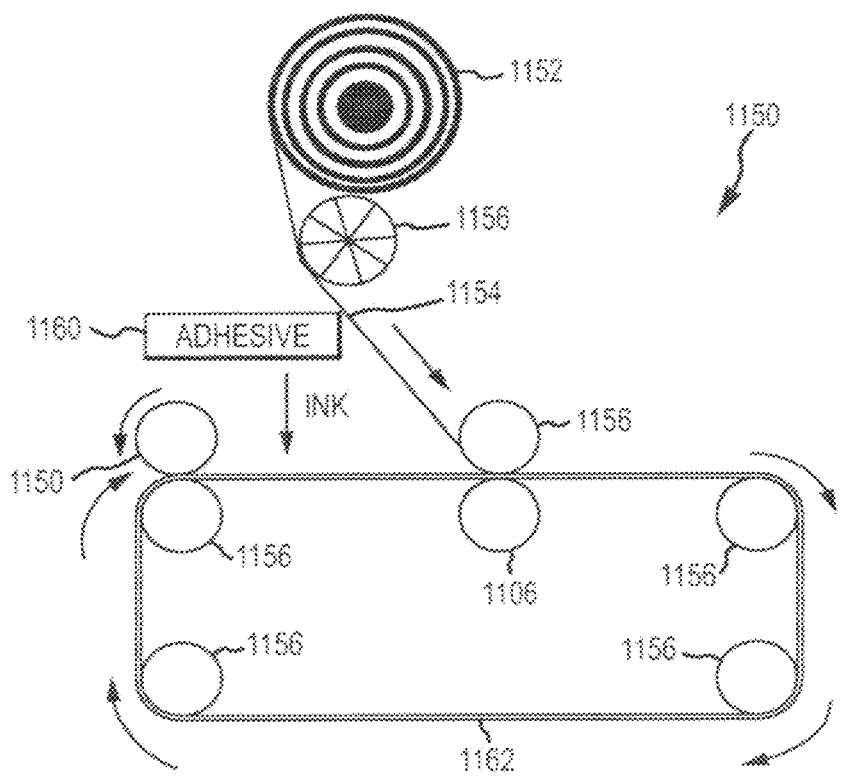
FIG. 11B is a schematic diagram of an alternate embodiment of a system for manufacturing a heat exchanger.

In an alternate embodiment, FIG. 11B depicts a continuous web system 1150 in which a single web 1154 of film or foil is drawn from a spool 1152 and entrained through a number of tension/pinch wheels 1156. The web 1154 is continually adhered to itself in order to create a multiple layer sheet 1162 that can be expanded in to a microchannel heat exchanger. An alternative bonding system is also presented in FIG. 11B. In this implementation, an "ink jet" printer 1160 may print a pattern of adhesive onto the surface of the multiple layer sheet 1162 to bond it to another portion of the web 1154 unrolling off the spool 1152. In order to create the alternating flow patterns for hot and cold fluid, the "ink jet" printer 1160 would change the print pattern after the multiple layer sheet 1162 completes a revolution around the loop.

Figure 12A:
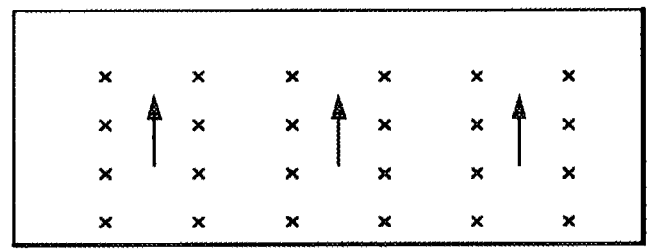
FIGS. 12A-12C are schematic diagrams of a connection pattern for a cross flow expanded heat exchanger.
Figure 12B:
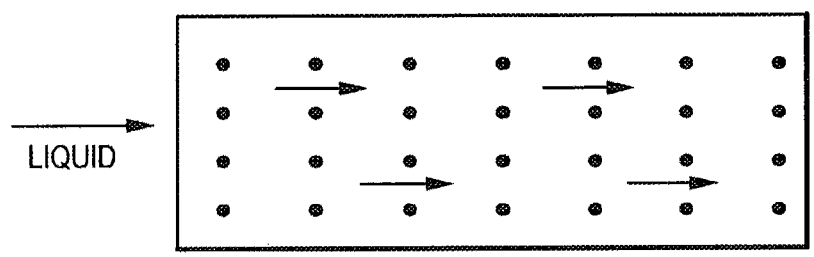
Figure 12C:
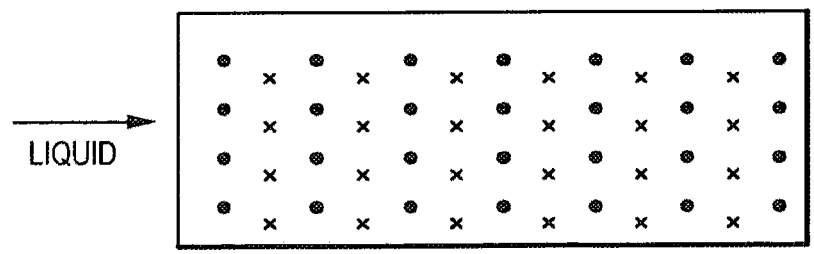

Counterflow is appropriate when the two fluids have similar heat capacity rates (the product of density, heat capacity, temperature change, and flow rate). However, in the case of a gas coupled with a liquid or phase change material, the heat capacity rate is often very different. In this case, cross flow is more appropriate for maximizing heat transfer. Cross flow can be achieved with implementations of the expanded heat exchanger disclosed herein with a connection pattern similar to the manifold of FIG. 9A. A similar crossflow arrangement is shown in FIGS. 12A-C, in which spot welds for the air layer are depicted in FIG. 12A as "X's" and are patterned in conjunction with the two vertical adhesion lines forming lateral end walls to contain the vertical flow and the spot welds for the liquid layer are depicted as "O's" and are patterned in conjunction with the two horizontal adhesion lines forming top and bottom end walls to contain the horizontal flow.

Figure 13A:
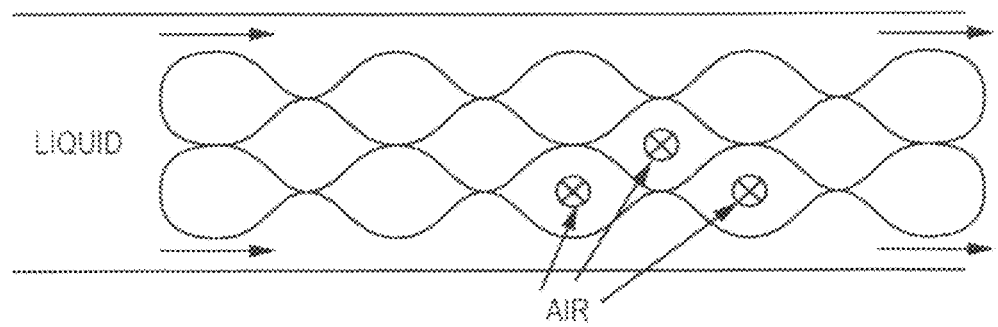
FIGS. 13A-13C are schematic diagrams illustrating flow for alternative flow configurations.
Figure 13B:
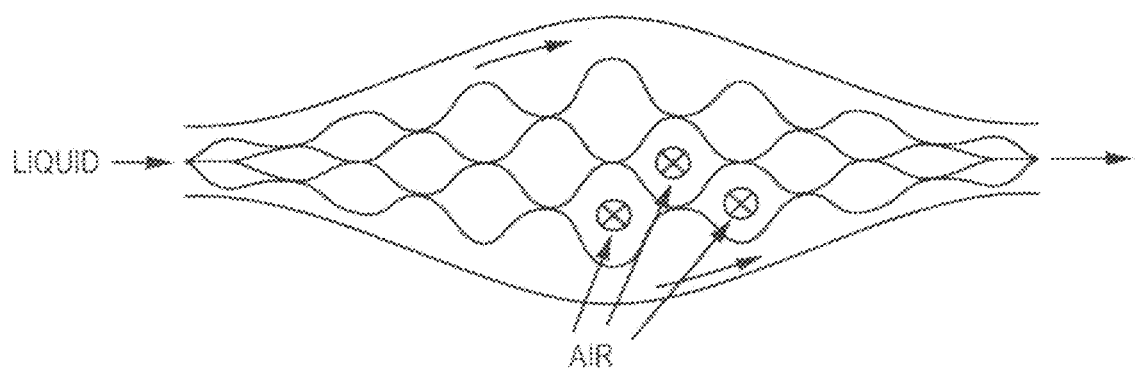
Figure 13C:
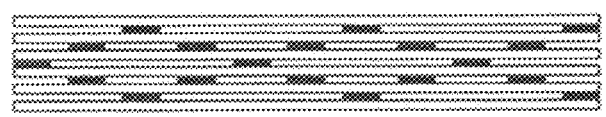
Figure 13D:
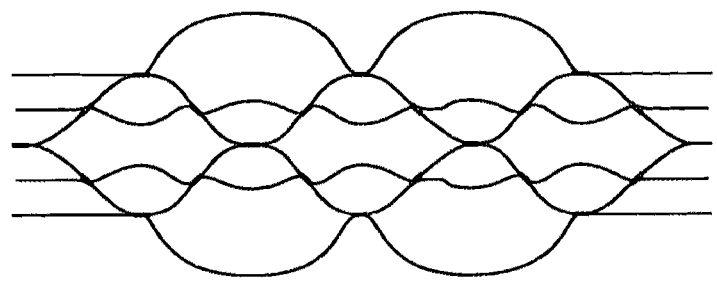

If the heat capacity rate is very unequal, cross flow coupled with fins on the gas side may be used. This can be achieved in the expanded heat exchanger as disclosed herein by having multiple gas layers with the connection pattern similar to the "X's" in FIG. 12 in that the sides are closed, but the dots would alternate between the "X" and "O" pattern so that no welds on adjacent layers overlaps (which would prevent expansion). FIGS. 13A and 13B show the flow arrangement for three air layers per liquid layer. FIG. 13A shows a normal cross flow and FIG. 13B depicts an embodiment in which the sidewall welds for the air layers do overlap, reducing expansion, thus reducing the amount of liquid from which heat can be effectively transferred. FIG. 13C depicts a counterflow embodiment in which every other weld is skipped for one of the flow directions, which opens up more flow area. This configuration may be advantageous for achieving desired heat transfer results for fluids of slightly different heat capacities, densities, viscosities or flow rates. However, if two very different fluids were used, it would likely be better to use cross flow designs.

Achieving High Effectiveness

As explained with reference to Equation 1, the effectiveness $\eta$ of a heat exchanger is the amount of heat transferred as a fraction of the maximum amount that can be transferred (or roughly the temperature (T) change as a fraction of the ideal temperature change). Typical heat exchanger $\eta$ is 60-80%; however, certain applications demand higher $\eta$. In one such application, air is heated to approximately 300° C. and run over a catalyst to destroy organic compounds, such as chemical weapons. This is basically an air pasteurizer with 97% $\eta$ and 0.8 mm high channels for this application. In this example, an axial conduction (i.e., in the same direction as the fluid flow) may be problematic with stainless steel exchange channels, but ceramic has been used as an alternate material to better effect. Another application where high $\eta$ is required is in cryogenic refrigeration cycles. In one example, a helium heat exchanger for a space application has reached $\eta=99.8\%$.

Typically, heat exchangers use metals to form the channels. However, the present disclosure describes implementations of polymer microchannel heat exchangers. Though the thermal conductivity of polymers is generally orders of magnitude lower than metals, if the polymer walls are made thin, the thermal resistance typically becomes negligible.

Figure 1:
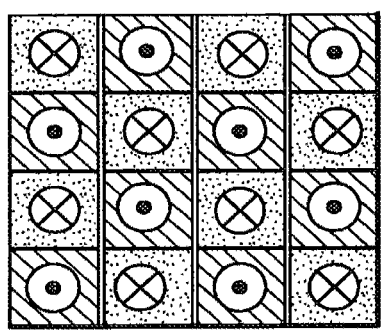
FIG. 1 depicts a cross-section end view of an extruded "chessboard" pattern of a prior art heat exchanger.
Figure 1:
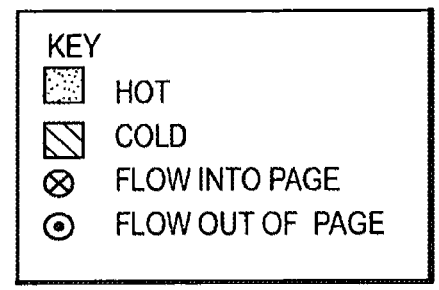
Figure 2:
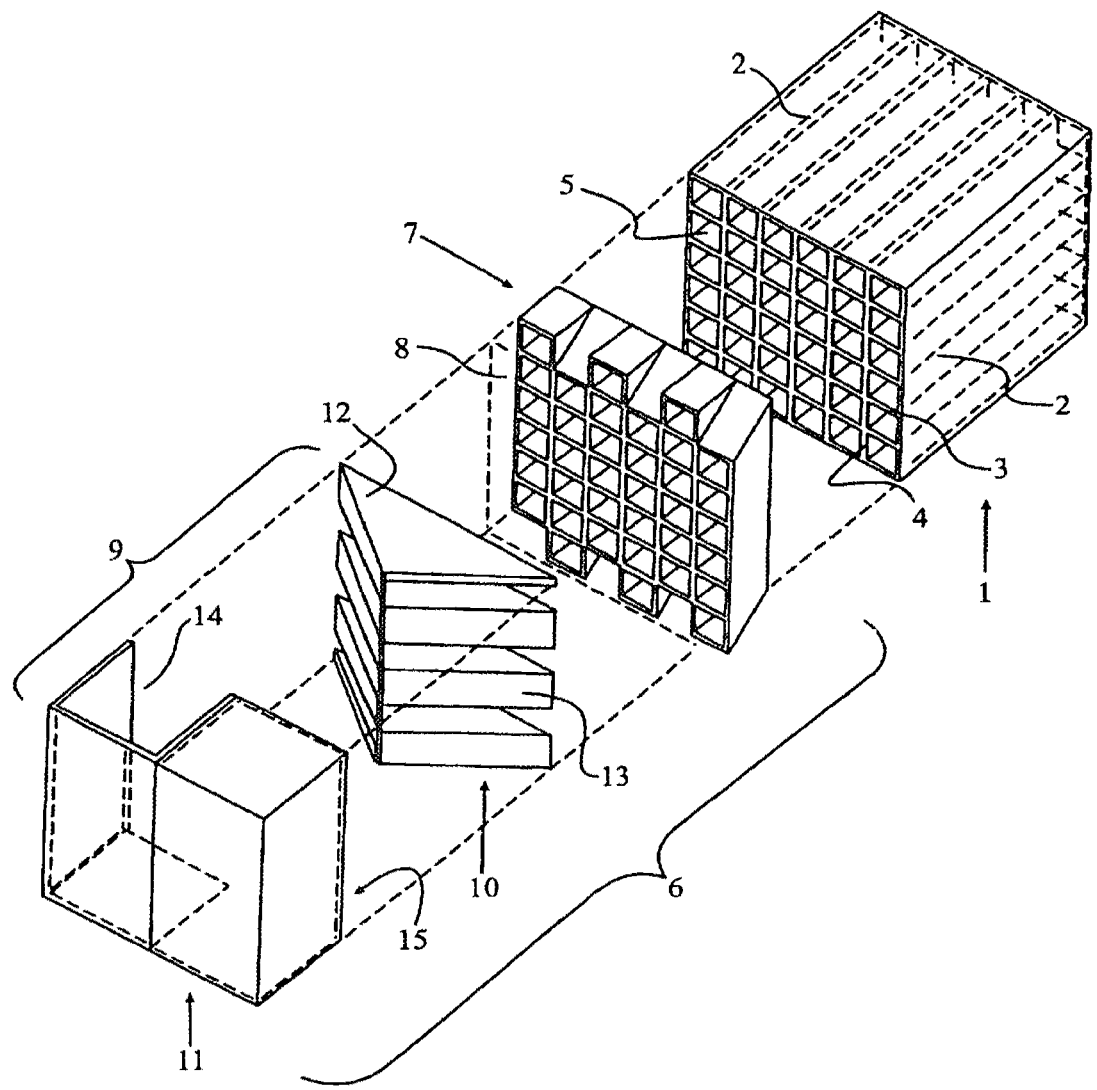
FIG. 2 depicts a prior art manifold arrangement for the chessboard heat exchanger of FIG. 1.
Figure 3:
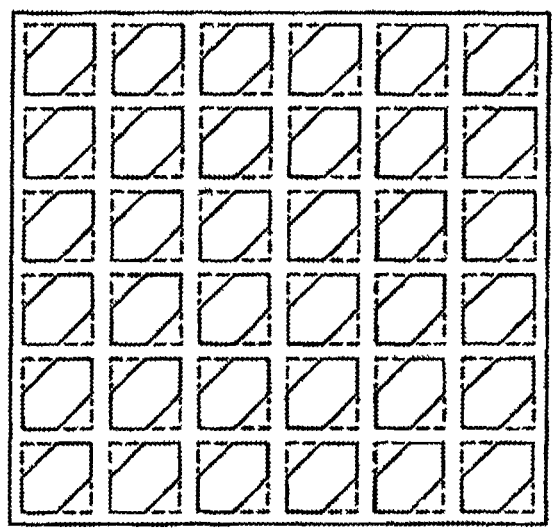
FIG. 3 depicts a prior art diagonal manifold for the chessboard heat exchanger of FIG. 1.
Figure 4:
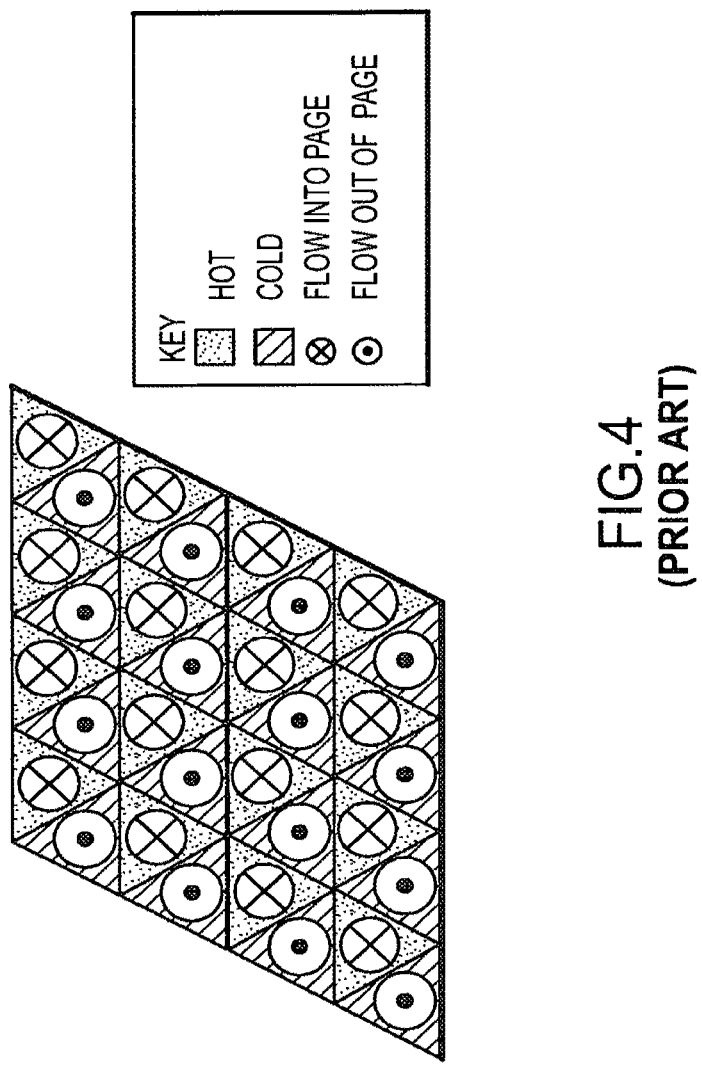
FIG. 4 depicts a prior art triangular heat exchanger core.

The following are "factor of two" accuracy calculations performed to demonstrate the feasibility of polymer microchannel heat exchangers. The geometry is adjacent same-sized channels, which may be achieved with the plate and frame heat exchanger or square or triangular passages (see FIG. 1 or FIG. 4). For non-finned heat exchangers, no fouling, thin walls, and fluids with equal h's on both sides of the exchange material, $$U = \frac{1}{\frac{2}{h_f} + \frac{t_w}{k_w}}, \qquad \text{Equation 2}$$

where U is the overall heat transfer coefficient per unit area (W/(m²K)), $k_w$ is the thermal conductivity of the material (W/(mK)), $h^f$ is the individual convection heat transfer coefficient for each fluid (W/(m²K)), and $t_w$ is the wall thickness (m).

Figure 14:
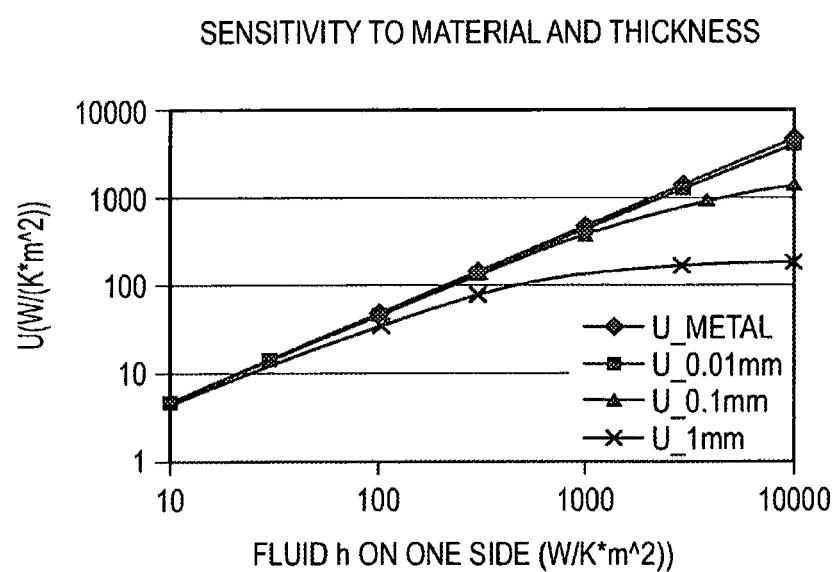
FIG. 14 is a graph depicting sensitivity of overall heat transfer coefficient (U) to material and thickness with metal and different polymer thicknesses.

The thermal resistance of polymer tubes can be small relative to the thermal resistance in the fluid. This is plotted in FIG. 14. The following may be understood from FIG. 14:
  U approaches one half the fluid h when the material resistance is negligible;
  1 mm metal thermal resistance is negligible;
  1 mm polymer presents small thermal resistance for turbulent gas or 1 mm diameter tube with laminar gas (h~100 W/(m*K));
  0.1 mm polymer presents small thermal resistance for 0.1 mm diameter tube with laminar gas or 1 mm diameter tube with laminar liquid or turbulent liquid (h~1000 W/(m*K)); and 0.01 mm polymer presents small thermal resistance for 0.1 mm diameter tube with laminar liquid (h~10,000 W/(m*K)).

Fouling is the buildup of material on the heat transfer surfaces and it makes the lower k of the polymer relatively even less important. Also, the low k of a polymer is actually an advantage for high η heat exchangers because it has reduced axial conduction.

The approximate cost of common heat exchanger materials are as follows:
  60 $/L: teflon, liquid crystal polymer (high k);
  30 $/L: stainless steel, copper;
  6 $/L: aluminum;
  3 $/L: steel, medium cost polymer (polyvinyl chloride (PVC), acrylic, polyester); and
  1 $/L: cheap polymer (low density polyethylene (LDPE), polypropylene (PE), polystyrene)).
(Askeland, D. R. The Science and Engineering of Materials Third Edition. PWS Publishing Company, Boston, 1994.) Inflation has increased these prices, but the relative prices should be similar.

Combining the overall heat transfer coefficient (U), the thickness of the material (t), and the cost of the material, we get the rough material cost per heat transfer ability, $D_{HT}$ (note use either $D_v$ in $/L and t in mm or $D_v$ in $/m$^3$ and t in m):

$$D_{HT} = D_V * \frac{t}{U} \quad \text{Equation 3}$$

0.5 $/(W/K): flue gas condensing (1 mm stainless steel, U~60 W/(m*K));
  0.05 $/(W/K): flue gas non-condensing or heat recovery ventilator (1 mm steel, U~60 W/(m*K));
  0.05 $/(W/K): air-to-air (5 mm diameter tubes, 1 mm PVC, U~60 W/(m*K));
  0.03 $/(W/K): air side of air conditioner or rotary (0.1 mm Al, 1 mm air, to U~20 W/(m*K));
  0.03 $/(W/K): cooling tower (0.5 mm PVC, U~50 W/(m*K));
  0.015 $/(W/K): water-to-water (or refrigerant) (1 mm copper, U~2000 W/(m*K));
  0.015 $/(W/K): water-to-water (5 mm diameter tubes, 1 mm PVC, U~200 W/(m*K));
  0.001 $/(W/K): air-to-air (1 mm diameter tubes, 0.1 mm LDPE, U=100 W/(m*K)), and
  0.00005 $/(W/K): water-to-water: (1 mm tubes, 0.1 mm LDPE, U=2000 W/(m*K)).

The total cost includes the material cost and the manufacturing cost. The manufacturing cost of the expanded heat exchanger may be made small with mass production. Other advantages of a microchannel heat exchanger include smaller size and weight and less noise from the heat exchanger and pump (or fan).

The cost per heat transfer ability is lower for water despite the higher cost of copper because of the much higher heat transfer coefficient for water. If designers replace 1 mm metal with 1 mm medium cost polymer for air applications, there is no cost per area savings because the metal was regular steel and there is negligible reduction in U due to the polymer thermal resistance, so the $D_{HT}$ is approximately unchanged. If designers replace 1 mm metal with 1 mm medium cost polymer for water applications, there is a decrease in the cost per area because the metal was stainless steel, but the polymer thermal resistance causes problems (because of the higher h), so the $D_{HT}$ is approximately unchanged. However, there is a $D_{HT}$ advantage replacing stainless steel with polymer in the condensing part of the condensing furnace because the h is not as high as for liquid applications (and the low temperatures at this part of the furnace make this feasible).

Figure 15:
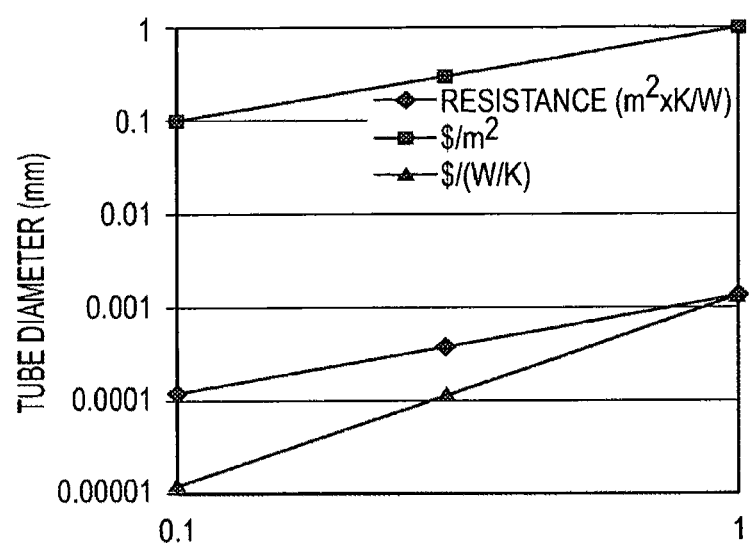
FIG. 15 is a graph depicting the thermal resistance (m^2*K/W), cost per area ($/m2), and cost per heat transfer ability ($/(W/K)) as a function of tube diameter (mm) of a heat exchanger.

Furthermore, if one can use 0.1 mm thick inexpensive polymer in 1 mm diameter channels (i.e., the same h as turbulent), this would yield ~30 times less cost per heat transfer ability. Also, if one uses 0.01 mm cheap polymer in 0.1 mm channels (10 times the h of turbulent), this would give ~3000 times less cost per heat transfer ability. The scaling advantage is shown in FIG. 15. For a constant ratio between wall thickness and channel diameter (in this case 0.1), the overall thermal resistance scales with the diameter, and so does the cost, so the cost per heat transfer ability follows the square of the diameter. Therefore, a small diameter is highly advantageous.

Even if the cost of the heat exchanger can be made very small, there is still the issue of the head (pressure) loss. The Nu of laminar flow is independent of flow speed. Therefore, the velocity and path length can be decreased and the cross sectional area increased such that η is maintained, but head losses are made arbitrarily small. For example, if the velocity is made 1/10×, the face area would be 10× and the path length would be 1/10×. Since the head loss for laminar flow is proportional to length*velocity/diameter$^2$, the head loss would be 1/100×.

If one decreases diameter to 1/10× as described in the present disclosure, $D_{HT}$ would be reduced to 1/100×, and if ineffectiveness is decreased to 1/10×, then the U must increase 10× for balanced flow. If the same velocity is maintained, the length would be 1/10×, so the head loss would be 10×. To decrease head loss to 1/10× the original while maintaining the new high q requires 1/100× the path length of the original, 1/10× the face velocity, and 10× the face area. For air paths a 0.1 mm path length for 0.1 mm channels may be workable.

Polymers

Polymers are already being used for heat exchangers in corrosive environments, such as industrial applications and condensing furnaces, and have been proposed for ocean thermal energy conversion. Also, the low cost of polymers are attractive in air-to-air applications, where the thermal resistance in the fluid is high. In high-pressure applications, where the polymer cannot be made as thin, additives such as graphite can increase the thermal conductivity of the polymer. Also, fiber reinforcement increases strength and temperature resistance of polymers. One known heat exchanger has been designed to handle 60 atmospheres, which is sufficient for refrigerant cycles. The fouling of polymers is generally less than metals because the polymers are hydrophobic and expand more with temperature changes, thereby shedding fouling coatings.

Most current heat exchangers use metals. Although the thermal conductivity of polymers is generally orders of magnitude lower than metals, as long as the polymer walls' are made thin, as described herein, the thermal resistance may become negligible. Other materials may also be used, including ceramic precursors.

Though the use of laser welding may limit the choice of polymers to those with a laser welding range such as polyethylene, polystyrene, and polypropylene as shown in FIG. 16, other connection methods such as adhesives expand the polymers that may be used according to the present disclosure to include, without limitation, polyvinyl chloride (PVC), polyurethane, acrylonitrile-butadiene-styrene (ABS), polyester, phenolic, polymethyl methacrylate (acrylic), polytetrafluoroethylene (Teflon), polycarbonate, epoxy, polychloroprene (neoprene), and silicone. Metals that may be used according to the present disclosure include, but are not limited to, aluminum, steel, copper, titanium, and silver. Ceramic precursors that may be used according to the present disclosure include, but are not limited to, poly (organosilazanes), poly(organosilylcarbodiimides) and poly (organosiloxanes) to produce the ceramics SiCO or SiCN.

Figure 17:
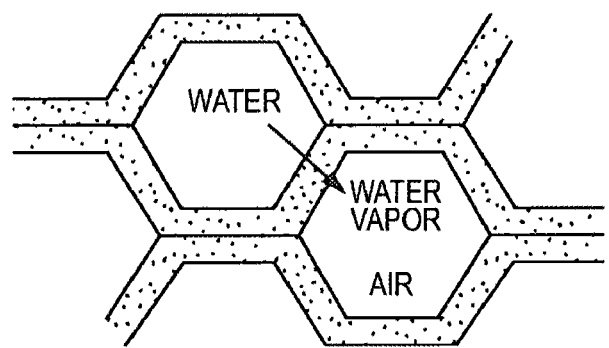
FIG. 17 is a schematic diagram of a heat exchanger interface with porous wall allowing vapor to pass therethrough.

The microchannel heat exchanger described herein may also be used in a cooling tower. A conventional cooling tower has water vapor evaporating from a water surface that is exposed directly to air. Typically, this is accomplished by splashing water on surfaces or running water as a film and flowing air next to the water to pick up humidity. The expanded heat exchanger confines water in channels. In order to use the expanded heat exchanger in this application, one could use a material where the walls are porous to water vapor and not water (e.g. Gore-Tex®), thereby allowing water to evaporate and pass through the walls and into the air in the adjacent channels as illustrated in FIG. 17. Cooling towers of such a design could benefit from the low manufacturing cost and small channel size and the accompanying low material cost and pumping power. The pores in the channel walls would also provide the added benefit of excluding bacteria and dust. The expanded heat exchanger disclosed herein may be used in a similar way for other processes that require mass transfer.

Laser Welding

Laser welding is one way to achieve an expanded microchannel heat exchanger as described in more detail herein. To weld polymers, the temperature should be above the melting point, but below the decomposition point. The width of this range determines how easy it is to laser weld a polymer. Polymers that may be used, such as those shown in FIG. 16, include, but are not limited to, high density polyethylene (HDPE), polypropylene (PP), and polystyrene (PS).

Figure 18A:
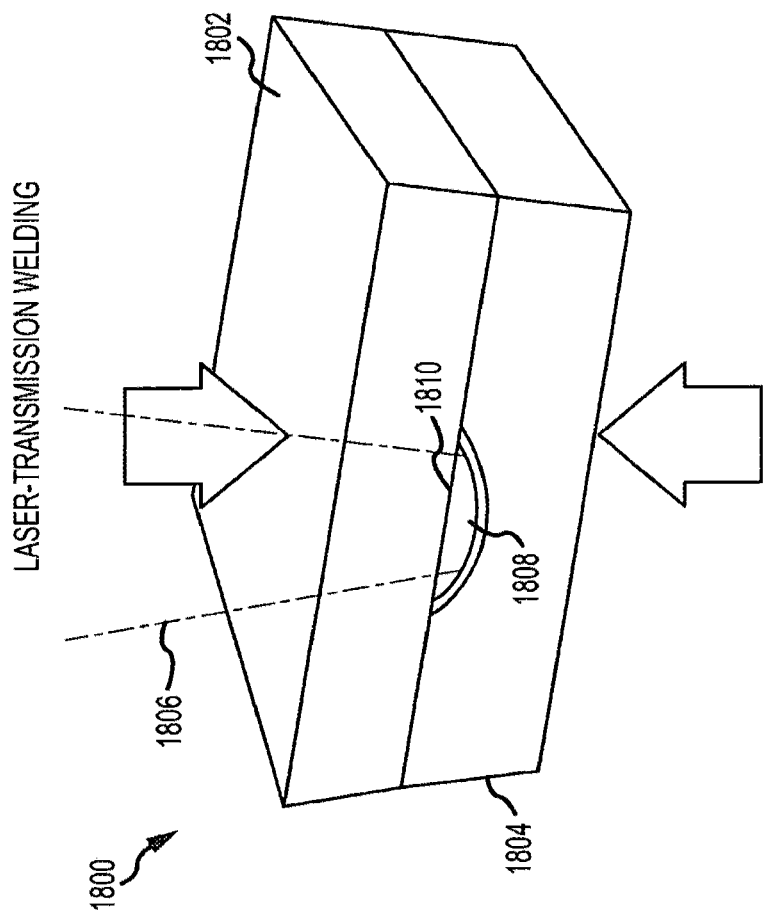
FIG. 18A is a schematic diagram depicting an exemplary prior art laser welding technique.

Generally, and as shown in FIG. 18A, in one technique for laser welding 1800, an upper polymer layer 1802 may be transparent to the laser energy 1806, and the lower layer 1804 may be opaque to the laser energy 1806. The laser energy 1806 heats the lower layer 1804 which conducts heat from the melting area 1808 to create a welded seam 1810 with the transparent upper layer 1802. However, this technique may only be effectively used to connect two layers together.

Another existing laser welding technique as described by Garst that may be used to generate a micro-channel heat exchanger is called reverse conduction laser welding 1820, and is shown in FIG. 18B. (Sebastiaan Garst, Matthias Schuenemanna, Matthew Solomon, Micah Atkinb, Erol Harveyac, "Fabrication of Multilayered Microfluidic 3D Polymer Packages," 2005 Electronic Components and Technology Conference). As shown in FIG. 18B, the laser energy 1830 passes through clear polymer layers 1822, 1824, 1826, is absorbed by a black metal substrate 1828. The heat from the metal substrate 1828 conducts up through the base polymer layer 1826 to form a weld 1832 of two of the polymer layers together 1824, 1826 (as shown on the left half of FIG. 18B). However, if exposure to to the laser energy 1834 is too long, the heat conducts through two layers 1824, 1826 and bonds three layers 1822, 1824, 1826 together (as shown on the right half of FIG. 18B), which may be undesirable for the manufacture of the heat exchangers as disclosed herein.

As shown in FIG. 18C, a new form of laser welding, termed forward conduction laser welding 1840, may also be used to generate a microchannel heat exchanger according to the present disclosure. As can be understood from FIG. 18C, an opaque top polymer sheet 1842 absorbs the laser energy 1848, and the heat conducts down through the top sheet 1842 to the middle polymer sheet 1844 immediately below to form a weld 1850 between the top and middle sheets 1842, 1844, but does not conduct through to melt the bottom polymer sheet 1846 or subsequent polymer sheets further below. Thus, successively stacked sheets can be welded to the sheets immediately below without welding more than the two adjacent sheets together at any one time, which provides the desired form for the heat exchanger designs disclosed herein.

Figure 19:
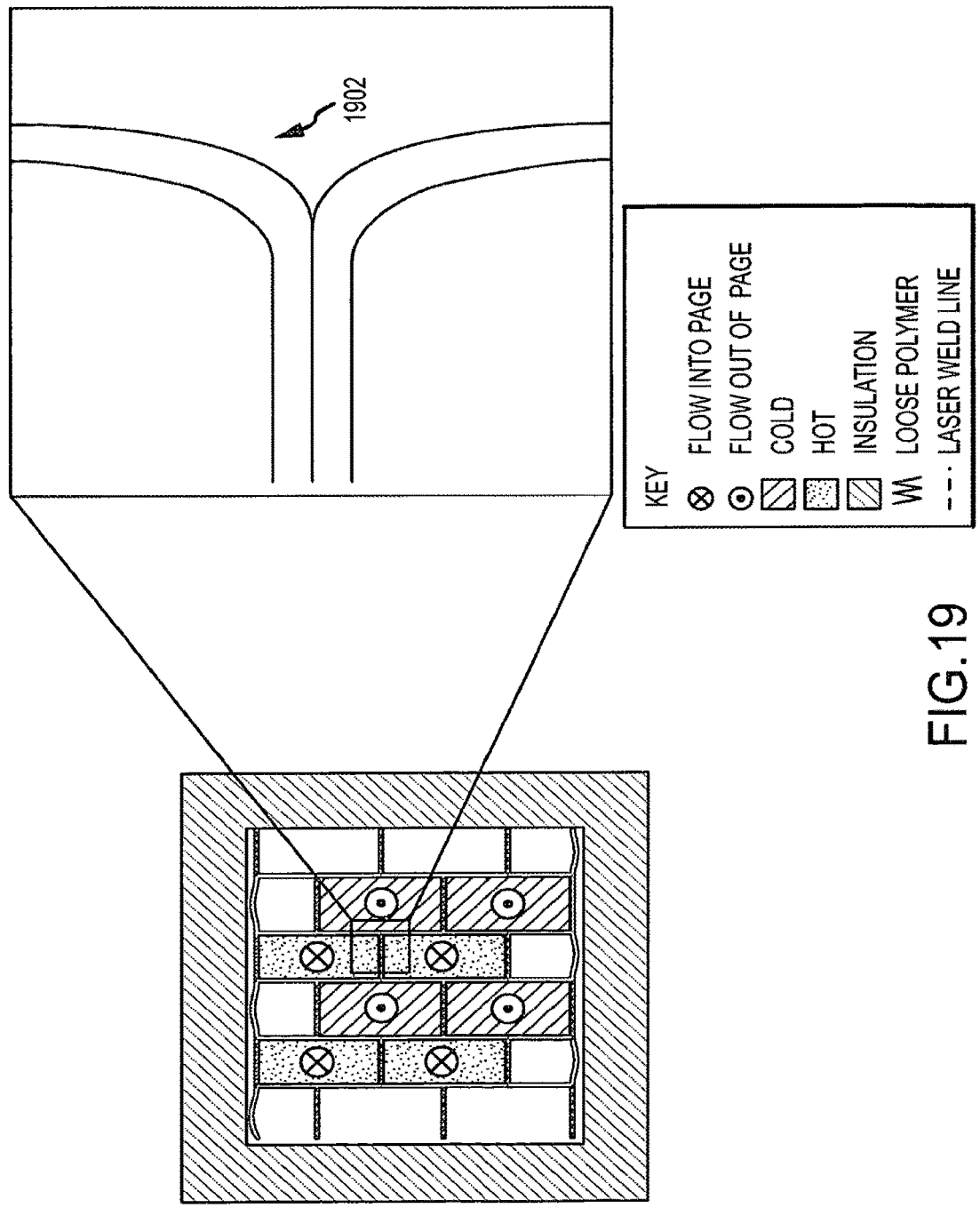
FIG. 19 illustrates the nonzero radius of curvature of the polymer sheet resulting from expansion.

In one exemplary test of the forward conduction laser welding technique, a laser welding machine was used and the patterns as shown in FIGS. 9A and 9B were programmed into the machine. A prototype was made with black LDPE (e.g., garbage bags) that were 28 μm thick. Detailed calculations on the ability of polymers to support the pressure of operation of the heat exchanger over time (creep) were performed. The maximum pressure that the prototype can withstand is ~0.1 atmospheres. The prototype was inflated by blowing with human lungs. Adhesive was used to seal the clear PVC tubes. Acrylic plates were glued to the top and bottom to retain the expansion. Also, an estimate of the impact of the polymer being bent during the expansion process was made, and the radius of curvature 1902 is nonzero, as shown in FIG. 19. When the heat exchanger is exposed to the pressure of operation, there will be a slack length that will allow greater deformation and could pinch off the channels. The steady state η of the prototype was predicted to be ~95% with ~2% channel size maldistribution (verified with measurements of a three-layer heat exchanger), which causes flow maldistribution, i.e., not all the 35 channels in each direction get the same flow.

Figure 20:
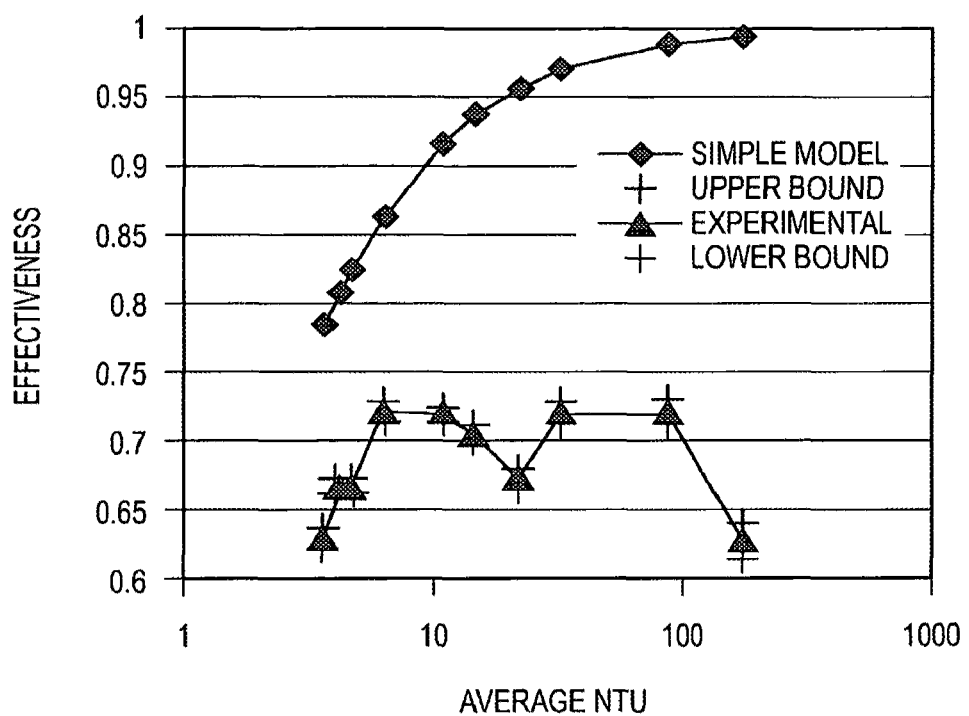
FIG. 20 is a line graph depicting experimental microchannel heat exchanger η and simple model η as a function of average NTU.

The heat exchanger was optimized to minimize the sum of the cost of the heat exchanger and the fuel. For balanced flow on the two sides of the heat exchanger, the reduction in ineffectiveness (1−η) and cost of the final heat exchanger scale with one divided by the square root of the reduction in the cost per heat transfer ability. This means that for the typical application with a cost per heat transfer ability reduction of a factor of 100, typical η would change from 70% to 97%, and the cost of the heat exchanger would be one tenth as much. For unbalanced flow, the results are even more favorable. FIG. 20 shows that at low NTU (high flow), the η trend was similar to simple (idealized) model. Then flow maldistribution causes a plateau. Finally axial conduction and heat leak (to the environment) dominate at high NTU (low flow), actually lowering η.

Figure 21:
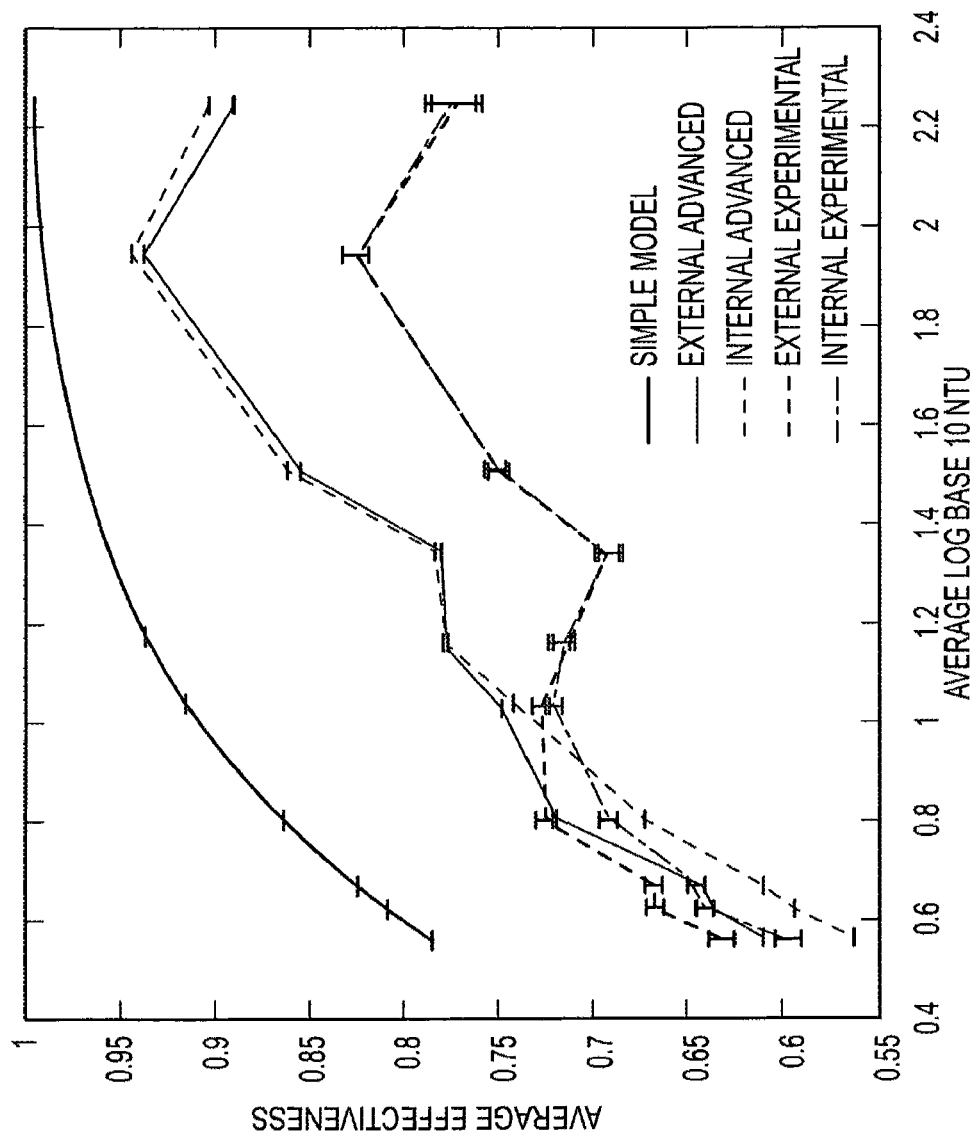
FIG. 21 is a line graph depicting experimental microchannel heat exchanger η and advanced model internal and external η compared to simple model average η as a function of average NTU.

Since flow maldistribution caused a significant η penalty, a CT scan was used, which allowed measurement of the 70 channels at 24 axial positions, resulting in 1680 pieces of data. This data was entered into a specially developed Matlab model. Some of the results are shown in FIG. 21. Adjusted for heat loss in the entry tubes, the maximum η of the actual heat exchanger was ~80% experimentally, and ~90% calculated. There are a number of modifications that could be made to the model to increase its accuracy. Further, there are a number of modifications to the original design that could be made that would increase the effectiveness, such as using more dot welds in the core and using only dot welds in the manifold. This should distribute the fluid more evenly, reducing the flow maldistribution problem. Also, due to the low cost manufacturing, it would be economically feasible to have multiple serial stages, that is one heat exchanger after another. This solves the problem of flow maldistribution, and allows the overall effectiveness to approach 100%.

For a typical laser spot size of 1 mm and a speed of 50 mm/s, an exposure time of 0.02 s results, which would diffuse approximately 0.05 mm for polyethylene (PE). The intensity and exposure time of the laser have to be controlled very carefully, such that the weld does not penetrate to additional layers. The exposure time depends on the sheet thickness and the material. The exposure time is proportional to the thickness squared and inversely proportional to the thermal diffusivity. Therefore, the exposure time for 0.01 mm and 0.1 mm PE would be 0.0011 s and 0.11 s, respectively. Since the thermal diffusivity of PE ~1E-7 $m^2$/s, and the diffusivity of aluminum is ~1E-4 $m^2$/s, 0.03 mm aluminum exposure time would have to be 1E-5 s. This could be achieved with a 0.01 mm spot moving at 1000 mm/s.

The suitability of a material for reverse or forward conduction laser welding can roughly be characterized by the viable range (i.e., the boiling or decomposition temperature minus the melting temperature) divided by the maximum temperature rise (i.e., the boiling or decomposition temperature minus the ambient temperature). Values for candidate materials for different ambient temperatures are shown in FIG. 22. Higher ambient temperatures increase the percent range, but sufficient strength must be maintained to unroll the material from spools, at least for the mass production process, as described in more detail with respect to FIG. 11. An ambient temperature of half the melting temperature in degrees Celsius has been chosen (e.g., if the melting temperature is 170° C., the ambient temperature would be 85° C.). A test sample formed with LDPE at 20° C. was successful (>64% range, as LDPE melts at a lower temperature than HDPE), so it is postulated that all the metals may be used successfully, though the increase in ambient temperature would make the manufacturing process more expensive for iron and titanium. Therefore, for high temperature applications that demand high corrosion resistance, silver may be used instead of stainless steel because only a small amount of material is required. The pure or nearly pure forms of these metals would be preferred because they have great elongation (i.e., stretching before breaking) for the expansion process as even "non-stretching" expansion requires bending of the material with accompanying plastic deformation. This means the tensile strength would be lower than the metal alloys, but it is still significantly higher than polymers, so metals can be used for high pressure and temperature applications.

Heat Sink Applications

Figure 24:
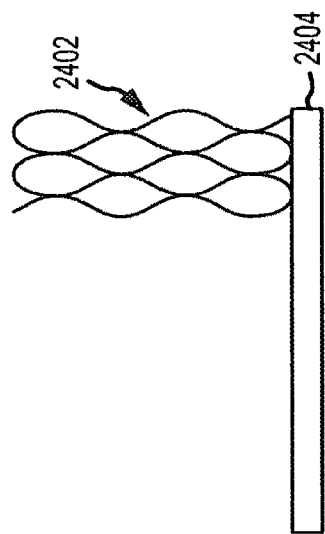
FIG. 24 is a schematic diagram of a heat sink with vertical fins.
Figure 23:
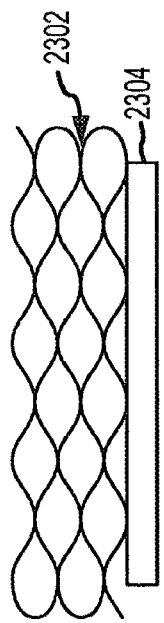
FIG. 23 is a schematic diagram of a heat sink with horizontal fins.
Figure 25:
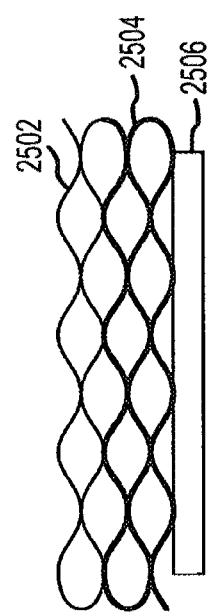
FIG. 25 is a schematic diagram of a heat sink with horizontal fins of varying thickness.

As explained before, heat exchangers transfer heat from one fluid to another. Therefore, the cooling of electronics with air is not a heat exchanger, because the heat is being transferred from a solid to a fluid. This is called a heat sink. As shown in FIGS. 23-25, the expanded pattern can act as fins on the heat sink. Current manufacturing techniques are limited in the fin thickness and spacing. The techniques disclosed herein for the manufacture of expanded heat exchange layers allows more flexibility. FIG. 23 depicts several layers of expanded microchannels 2302 mounted on an electronic component 2304 in order to draw heat away from the component 2304 and transfer the heat to air blowing through the microchannels 2302 from a fan typically mounted within the electronic device to cool the device. FIG. 24 depicts several layers of expanded microchannels 2402 mounted in a vertical orientation on an electronic component 2404. Such an embodiment may be desirable to reduce the distance that the heat must conduct. As shown in FIG. 25, it may also be advantageous to provide thicker channel layers 2504 (fins) be near the base where mounted to the electrical component 2506 because more heat has to be conducted and thinner channel layers 2502 above the thicker channel layers 2504 because less heat has to be conducted (i.e., some has already been transferred to the air). This configuration can easily be achieved with the expanded heat exchanger techniques. Using weld dots instead of weld lines would also allow two-dimensional airflow. This may be beneficial for vertical fins if the fan is pointing towards the heat sink base because the air has to deflect the side.

Other Considerations for Incorporation into Microchannel Expanded Heat Exchanger One practical consideration is the fouling of a heat exchanger. This can be due to chemical agents, such as scale deposition. Scale deposition occurs when the water becomes supersaturated with respect to its solutes, typically in recirculating systems. There are a variety of solutions to this problem, including dilution, prevention of deposition on the walls by magnetic means, and scale removal by physical or chemical means. Fouling can also result from physical means, for example, particle deposition. In general, the particles may be less than one-third the channel size to avoid clogging. Polymers are generally more resistant to fouling because of low surface energy and also the thermal cycling causes to significant expansion and contraction, shedding fouling layers.

The wall of the heat exchanger can also be physically eroded. The erosion rate of polymer pipes is generally less than that of metal pipes, and the wear decreases with particle size and velocity, stronger than linearly. Turbulence is generally the cause of wear because it imparts particles with velocity components perpendicular to the wall. However, even in a laminar flow heat exchanger, the manifold may be turbulent, or if not turbulent, there still will be direction changes, so there may be an impingement of particles on the walls. Assuming that the wall thickness scales with the channel dimension, the particle size may scale with the wall thickness to avoid clogging, and since the erosion rate falls faster than the particle size, this means that percent erosion rate of the wall thickness would be smaller. Also, generally, the velocity falls with smaller channels, in order to reduce friction. This would further reduce the percent erosion rate. Therefore, wall erosion is not likely to be a serious problem for microchannel heat exchangers, and polymer microchannel heat exchangers are particularly resistant to erosion.

Because the temperature of the heat exchanger will vary, thermal stresses may result. One way of reducing these stresses is by using the same material throughout. Polymers are also susceptible to ultraviolet radiation, but can have additives to reflect or absorb the light to protect the polymer. Also, a rigid container may be required around a flexible polymer heat exchanger, and the rigid container can easily be made UV resistant.

All directional references (e.g., proximal, distal, upper, lower, upward, downward, left, right, lateral, longitudinal, front, back, top, bottom, above, below, vertical, horizontal, radial, axial, clockwise, and counterclockwise) are only used for identification purposes to aid the reader's understanding of the present invention, and do not create limitations, particularly as to the position, orientation, or use of the invention. Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other. The exemplary drawings are for purposes of illustration only and the dimensions, positions, order and relative sizes reflected in the drawings attached hereto may vary.

The above specification, examples and data provide a complete description of the structure and use of exemplary embodiments of the invention as claimed below. All references described herein are incorporated by reference in their entirety as if their contents were a part of the present disclosure. Although various embodiments of the invention as claimed have been described above with a certain degree of particularity, or with reference to one or more individual embodiments, those skilled in the art could make numerous alterations to the disclosed embodiments without departing from the spirit or scope of this invention. Other embodiments are therefore contemplated. It is intended that all matter contained in the above description and shown in the accompanying drawings shall be interpreted as illustrative only of particular embodiments and not limiting. Changes in detail or structure may be made without departing from the basic elements of the invention as defined in the following claims.

What is claimed is:

1. A method of manufacturing a microchannel heat exchanger comprising
   providing a first flat sheet of material and a second flat sheet of material;
   providing a first connection pattern for integral formation of a core portion and a manifold portion between and out of the first and second flat sheets of material;
   operably bonding the first and second flat sheets of material to form seals between the first and second flat sheets of material according to the first connection pattern;
   providing a third flat sheet of material;
   providing a second, different connection pattern for integral formation of the core portion and the manifold portion between and out of the second and third flat sheets of material;
   superposing the third flat sheet of material onto the second flat sheet of material;
   operably bonding the third flat sheet of material to the second flat sheet of material to form seals between the second and third flat sheets of material according to the second connection pattern without bonding the third flat sheet of material to the first flat sheet of material to generate the core portion and the manifold portion integrally;
   providing a fourth flat sheet of material;
   superposing the fourth flat sheet of material onto the third flat sheet of material;
   operably bonding the fourth flat sheet of material to the third flat sheet of material to form seals between the third and fourth flat sheets of material according to the first connection pattern without bonding the fourth flat sheet of material to the second flat sheet of material to generate the core portion and the manifold portion integrally;
   providing at least a fifth flat sheet of material;
   superposing the fifth flat sheet of material onto the fourth flat sheet of material;
   operably bonding the fifth flat sheet of material to the fourth flat sheet of material to form seals between the fourth and fifth flat sheets of material according to the second connection pattern without bonding the fifth flat sheet of material to the third flat sheet of material to generate the core portion and the manifold portion integrally; and
   expanding interstices between the first, second, third, fourth, and fifth flat sheets of material bounded by the seals in the respective first and second connection patterns to create
   a first layer of the core portion, including a first fluid flow layer, integrated with a first layer of the manifold portion between the first and second flat sheets of material,
   a second layer of the core portion, including a second fluid flow layer, integrated with a second layer of the manifold portion between the second and third flat sheets of material,
   a third layer of the core portion, including a third fluid flow layer, integrated with a third layer of the manifold portion between the third and fourth flat sheets of material, and
   at least a fourth layer of the core portion, including a fourth fluid flow layer, integrated with a fourth layer of the manifold portion between the fourth and fifth flat sheets of material.

2. The method of claim 1 further comprising designing the first connection pattern to provide fluid flow channels within the manifold portion between the first and second sheets that are substantially perpendicular to fluid flow channels within the manifold portion between the second and third sheets provided by the second connection pattern.

3. The method of claim 1, wherein the bonding operations further comprise laser welding via a forward conduction laser welding technique.

4. The method of claim 3 further comprising
   providing a laser energy source;
   arranging the first flat sheet beneath the second flat sheet, wherein the second flat sheet is opaque to absorb laser energy;
   bonding portions of the first and second flat sheets in the first bonding operation in the first connection pattern by welding through absorption of the laser energy such that heat conducts downward through the opaque second flat sheet to the first flat sheet immediately below to bond the portions of the first and second flat sheets;
   arranging the bonded first and second flat sheets beneath the third flat sheet such that the third flat sheet is adjacent the second flat sheet, wherein the third flat sheet is opaque to absorb laser energy;
   bonding portions of the second and third flat sheets in the second bonding operation in the second pattern by welding through absorption of the laser energy such that heat conducts downward through the opaque third flat sheet to the second flat sheet immediately below to bond the portions of the second and third flat sheets, but does not conduct further through the second flat sheet to bond the second flat sheet with the first flat sheet further below in the second connection pattern.

5. The method of claim 4 further comprising providing the flat sheets of material as separate continuous webs of flexible material.

6. The method of claim 4 further comprising providing the flat sheets of material from a single continuous web of flexible material.

7. The method of claim 4 further comprising providing a rotating drum mask that exposes portions of the flat sheets of material to be bonded in one or both of the first and second connection patterns.

8. The method of claim 1, wherein the second connection pattern defines wider widths for the second layer of separated, parallel fluid flow channels in the second layer of the core than widths of the first layer of separated, parallel fluid flow channels in the first layer of the core.

9. The method of claim 1, wherein the flat sheets of material are made of a thermally conductive material and form a heat sink.

10. The method of claim 1, wherein the core portion comprises a plurality of parallel channels extending axially therethrough when expanded.

11. The method of claim 1, wherein each of the flat sheets of material is a material selected from the group comprising polymers, metals, polymers that are ceramic precursors, and composites thereof.

12. The method of claim 11, wherein each of the flat sheets of material are the same material.

13. The method of claim 11, wherein at least one of the flat sheets of material is a different material than the other sheets of material.

14. The method of claim 1, wherein each of the flat sheets of material is made of a porous material impermeable to liquids but permeable to water vapor.

15. The method of claim 1 further comprising a flow configuration selected from the group comprising counter-flow, parallel flow, or cross flow.

16. The method of claim 1, wherein the first connection pattern provides fluid flow channels within the manifold portion between the first and second sheets that are substantially perpendicular to fluid flow channels within the manifold portion between the second and third sheets provided by the second connection pattern.

17. The method of claim 1, wherein the bonding steps are implemented using a technique selected from the group comprising welding, soldering, brazing, and adhering.

18. The method of claim 1, wherein the expanding operation may be performed by a method selected from a group comprising the following:
   introducing pressurized gas between the sheets;
   introducing pressurized liquid between the sheets;
   adding pressurized fluid undergoing a phase change between the sheets;
   adding pressurized fluid undergoing a chemical reaction between the sheets;
   pulling upward on the fifth sheet and downward on the first sheet with allowance for sideways contraction of the sheets; and
   pulling upward on the fifth sheet and downward on the first sheet with no allowance for sideways contraction of the sheets.

19. The method of claim 1 wherein after the expanding step the microchannel heat exchanger is permanently fixed in shape.

20. The method of claim 1 wherein after the expanding step the microchannel heat exchanger is collapsible.

\* \* \* \* \*